United States Patent
Park

(10) Patent No.: US 9,978,826 B2
(45) Date of Patent: May 22, 2018

(54) ORGANIC LIGHT EMITTING DISPLAY DEVICE

(71) Applicant: LG Display Co., Ltd., Seoul (KR)

(72) Inventor: Jaehee Park, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 14/960,024

(22) Filed: Dec. 4, 2015

(65) Prior Publication Data

US 2016/0163780 A1    Jun. 9, 2016

(30) Foreign Application Priority Data

Dec. 6, 2014 (KR) .......... 10-2014-0174509
Jun. 30, 2015 (KR) .......... 10-2015-0092696

(51) Int. Cl.
*H01L 27/32* (2006.01)

(52) U.S. Cl.
CPC ...... *H01L 27/3276* (2013.01); *H01L 27/3248* (2013.01); *H01L 27/3265* (2013.01); *H01L 27/3272* (2013.01)

(58) Field of Classification Search
CPC ................................. H01L 27/3276
See application file for complete search history.

(56) References Cited

U.S. PATENT DOCUMENTS

| 9,627,462 | B2* | 4/2017 | Kwon ............... H01L 27/3262 |
| 2004/0263710 | A1 | 12/2004 | Song et al. |
| 2007/0103608 | A1* | 5/2007 | Lee .................... G02F 1/13454 349/38 |
| 2010/0079419 | A1 | 4/2010 | Shibusawa |
| 2013/0235020 | A1 | 9/2013 | Kim et al. |
| 2013/0328863 | A1 | 12/2013 | Pirwani |

FOREIGN PATENT DOCUMENTS

| CN | 103489889 A | 1/2014 |
| CN | 104145213 A | 11/2014 |
| EP | 2 498 242 A1 | 9/2012 |
| JP | 2006-30635 A | 2/2006 |

* cited by examiner

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

An organic light emitting display device is discussed. The organic light emitting display device includes a driving thin film transistor including an active layer and a gate electrode; a storage capacitor including a first electrode and a second electrode; a first pattern electrode including the gate electrode and the first electrode; an anode disposed on the driving thin film transistor and the storage capacitor; a second pattern electrode connected with an anode contact part which connects an output electrode connected with the active layer and the anode; and a patterned semiconductor layer including the active layer having a semiconductive characteristic and a shield unit having a conductive characteristic.

17 Claims, 15 Drawing Sheets

ORGANIC LIGHT EMITTING DISPLAY DEVICE

CROSS-REFERENCE TO RELATED APPLICATIONS

This application claims the priority of Korean Patent Application No. 10-2014-0174509 filed on Dec. 6, 2014, and Korean Patent Application No. 10-2015-0092696 filed on Jun. 30, 2015, in the Korean Intellectual Property Office. All these application are incorporated herein by reference.

BACKGROUND OF THE INVENTION

Field of the Invention

The present disclosure relates to an organic light emitting display device; and more particularly, the organic light emitting display device of the present disclosure has reduced crosstalk, and improved luminance and image quality, by reducing a coupling effect caused by a parasitic capacitor.

Discussion of the Related Art

An organic light emitting display device is a self-light emitting display device and does not need a separate light source unlike a liquid crystal display device, and, thus, the organic light emitting display device can be manufactured into a lightweight and thin form. Further, the organic light emitting display device is advantageous in terms of power consumption because it is driven with a low voltage. Also, the organic light emitting display device has a high response speed, a wide viewing angle, and a high contrast ratio (CR). Therefore, the organic light emitting display device has attracted attention as a next-generation display device.

The organic light emitting display device includes a plurality of lines and a plurality of sub-pixels connected thereto. Each sub-pixel includes an organic light emitting element and a pixel circuit including a thin film transistor electrically connected with the organic light emitting element and a storage capacitor.

In recent years, as resolution of an organic light emitting display device has been improved, a gap between lines, and a gap between lines and a pixel circuit have become smaller. Because the gap between lines and a pixel circuit has become smaller, the pixel circuit and the lines form a parasitic capacitor and a plurality of signals is coupled. In particular, a coupling effect in an organic light emitting display device of the prior art can be generated between a data line and a gate electrode of a driving thin film transistor. Due to the coupling effect, a driving current supplied to an organic light emitting element is changed. Thus, an image quality of the organic light emitting display device of the prior art may deteriorate.

To be specific, deterioration in image quality may cause problems such as crosstalk and deterioration in luminance. The crosstalk, for example, may refer to a phenomenon that when white and black patterns are displayed on a display device, and if there is a great difference in electrical load between areas of the display device, a coupling effect increases. Thus, the white pattern increases the luminance in the black pattern. The deterioration in luminance may refer to a phenomenon that when an image signal intended to be displayed is input to a pixel, a coupling effect increases, and, thus, the luminance of the pixel decreases. That is, the coupling effect may cause generation of an unwanted electric field which deteriorates an image quality.

FIG. 1A and FIG. 1B are a schematic plane view and a cross-sectional view, respectively, illustrating a coupling effect caused by a parasitic capacitance Cp in an organic light emitting display device 100 of the prior art. The organic light emitting display device 100 includes a substrate 110, a driving thin film transistor 120, a storage capacitor 130, a switching thin film transistor 140, a data line 151, a VDD line 152, a gate line 153, and an organic light emitting display device 160 (refer to FIG. 1A). The data line 151 and the gate line 153 are disposed so as to intersect each other on the substrate 110. The organic light emitting element 160 includes an anode 161, an organic light emission layer 162, and a cathode 163. The organic light emitting element 160 emits a light having a wavelength in a visible ray range. Further, the luminance of the light is determined on the basis of an amount of a driving current input through the anode 161. The amount of the driving current is regulated by the driving thin film transistor 120 connected with the anode 161.

The driving thin film transistor 120 includes an active layer 121, a gate electrode 122 overlapping the active layer 121, and an input electrode 123 and an output electrode 124 connected with the active layer 121. The active layer 121 may refer to a channel or a semiconductor layer.

The input electrode 123 of the driving thin film transistor 120 is connected with the VDD line 152. For example, the VDD line 152 may be connected with the input electrode 123 through a connection line 154 disposed under the VDD line 152. The driving current transferred by the VDD line 152 is input to the anode 161 through the active layer 121 and the output electrode 124. The amount of the driving current flowing in the active layer 121 of the driving thin film transistor 120 is regulated by a voltage of an image signal supplied through the data line 151.

An overlap area between a first electrode 132 and a second electrode 131 may be considered as the storage capacitor 130. A data voltage (e.g., an image signal) is applied to the first electrode 132 and the storage capacitor 130 is charged with the data voltage (e.g., the image signal).

The gate electrode 122 is connected with the first electrode 132 of the storage capacitor 130. Therefore, a potential difference of the first electrode 132 is equal to that of the gate electrode 122.

The output electrode 124 is connected with the second electrode 131 of the storage capacitor 130. The storage capacitor 130 maintains a turn-on state of the driving thin film transistor 120 during an emission interval of the organic light emitting element 160. An anode contact part 161c is connected with the anode 161 of the organic light emitting element 160 (refer to FIG. 1B).

The data line 151 is disposed so as to be adjacent to the storage capacitor 130. The data line 151 is configured to transfer a data voltage (e.g., an image signal). As a gap between lines and the thin film transistor of a high-resolution organic light emitting display device 100 is decreased, a gap between the data line 151 and the first electrode 132 of the storage capacitor 130 may be decreased. As the gap between the data line 151 and the first electrode 132 of the storage capacitor 130 is decreased, a capacitance is formed between the data line 151 and the first electrode 132 of the storage capacitor 130. For convenience in explanation, the capacitance formed between the first electrode 132 of the storage capacitor 130 and the data line 151 is defined as a parasitic capacitance Cp.

To be specific, the data voltage (e.g., the image signal) is supplied to the first electrode 132 through the data line 151 and stored in the first electrode 132 of the storage capacitor 130. The first electrode 132 is in a floating state during an emission interval. During the interval, the data line 151 continuously and sequentially supplies various data voltages to other sub-pixels of the organic light emitting display device in response to a scan signal. The first electrode 132 and the data line 151 are coupled so as to generate the parasitic capacitance Cp. Further, the first electrode 132 is in a floating state and thus affected by the various data voltages supplied to the other sub-pixels.

A potential difference between the first electrode 132 and the data line 151 tends to be maintained by the parasitic capacitance Cp. That is, because the first electrode 132 is in a floating state, the data voltage stored in the first electrode 132 fluctuates due to various data voltages passing through the data line 151 in order to maintain a uniform potential difference with respect to the data line 151 by the parasitic capacitance Cp.

Therefore, a voltage of the gate electrode 122 of the driving thin film transistor 120 fluctuates with the fluctuation of the data voltage stored in the first electrode 132. The voltage of the gate electrode 122 controls the conductivity or electrical resistance of the active layer 121 which is a semiconductor material for regulating an amount of a current. When the voltage of the gate electrode 122 is changed, an amount of a current to be applied to the organic light emitting element 160 is changed accordingly. As a result, the luminance of the organic light emitting element 160 is changed.

In other words, the first electrode 132 of the storage capacitor 130 and the data line 151 are coupled by the parasitic capacitor Cp. That is, due to a change in data voltage applied to the data line 151, a voltage for the first electrode 132 of the storage capacitor 130 may be changed. Particularly, as a difference between the data voltage stored in the first electrode 132 and the current data voltage applied to the data line is increased, a degree of crosstalk increases.

In addition, a capacitor has a characteristic of maintaining a both-end voltage. Thus, if a data voltage applied to the data line 151 is changed, a voltage for the first electrode 132 of the storage capacitor 130 is also changed. Because the first electrode 132 of the storage capacitor 130 is connected with the gate electrode 122 of the driving thin film transistor 120, if the data voltage applied to the data line 151 is changed, a gate voltage of the gate electrode 122 of the driving thin film transistor 120 is also changed. That is, the gate voltage of the gate electrode 122 becomes equal to the data voltage stored in the first electrode 132.

As the gate voltage applied to the first gate electrode 122 of the driving thin film transistor 120 is changed, an amount of the driving current transferred to the anode 161 through the driving thin film transistor 120 is changed. That is, when a potential difference between the gate electrode 122 and the output electrode 124 of the driving thin film transistor 120 are uniformly maintained, the amount of the driving current can be uniformly maintained. However, because the gate electrode 122 of the driving thin film transistor 120 and the data line 151 are coupled with each other, the driving thin film transistor 120 cannot uniformly maintain the driving current. Particularly, as a pixel per inch (ppi) of the organic light emitting display device is increased, such a problem is worsened. Hereinafter, a function of uniformly maintaining an amount of a driving current flowing through the driving thin film transistor 120 will be defined as a current holding ratio (CHR). Hereinafter, a phenomenon that an amount of a driving current flowing through the driving thin film transistor 120 is coupled with an image signal of other sub-pixels and luminance is increased will be defined as crosstalk. As a current holding ratio of the driving thin film transistor 120 is decreased, the luminance of the organic light emitting element 160 is gradually decreased. Further, the luminance of the organic light emitting element 160 is coupled by a data voltage to be applied to the other sub-pixels according to the crosstalk. Thus, an image quality of the organic light emitting display device deteriorates. Further, as a parasitic capacitance is increased, the image quality of the organic light emitting display device deteriorates.

SUMMARY OF THE INVENTION

The inventors of the present disclosure recognized that in a high-resolution organic light emitting display device, a gap between a first electrode of a storage capacitor connected with a gate electrode of a driving thin film transistor and a data line is small. Thus, a parasitic capacitance is generated therebetween; and the data line and the gate electrode of the driving thin film transistor are coupled with each other by the parasitic capacitance, which causes a change in driving current to be transferred to an organic light emitting element. That is, luminance of the organic light emitting element is determined on the basis of an amount of the driving current. Further, if the gate electrode of the driving thin film transistor and the data line are coupled with each other, a charging voltage of the storage capacitor is changed during an emission interval of the organic light emitting element and a voltage of the gate electrode of the driving thin film transistor is changed. Thus, the inventors of the present disclosure invented a novel organic light emitting display device including a shield unit in order to reduce a coupling effect between the gate electrode of the driving thin film transistor and the data line.

Accordingly, an object of the present disclosure is to provide an organic light emitting display device capable of reducing a capacitance of a parasitic capacitance formed between a first electrode of a storage capacitor and a data line through a shield unit and thus reducing a coupling effect between a gate electrode of a driving thin film transistor and the data line.

Another object of the present disclosure is to provide an organic light emitting display device capable of improving a current holding ratio of a driving thin film transistor without an additional process by forming a shield unit to be extended from an active layer of the driving thin film transistor.

The objects of the present disclosure are not limited to the aforementioned objects, and other objects, which are not mentioned above, will be apparent to a person having ordinary skill in the art from the following description.

According to an aspect of the present disclosure to achieve the above-described objects, an organic light emitting display device includes a driving thin film transistor; a storage capacitor; a first pattern electrode; an anode; a second pattern electrode; and a patterned semiconductor layer. The driving thin film transistor includes an active layer and a gate electrode. The storage capacitor includes a first electrode and a second electrode. The first pattern electrode includes the gate electrode and the first electrode. The anode is disposed on the driving thin film transistor and the storage capacitor. The second pattern electrode is connected with an anode contact part which connects an output electrode connected with the active layer and the anode. The patterned semiconductor layer includes the active layer having a semiconductive characteristic; and a shield unit having a conductive characteristic.

According to another feature of the present disclosure, the organic light emitting display device further includes a data line configured to overlap the shield unit which is a portion of the patterned semiconductor layer.

According to yet another feature of the present disclosure, the organic light emitting display device further includes a data line. A distance between an edge of the first electrode and an edge of the adjacent shield unit is greater than a distance between the edge of the first electrode and an edge of the adjacent data line.

According to still another feature of the present disclosure, a portion of the shield unit overlapping the first pattern electrode is configured to have a semiconductive characteristic.

According to still another feature of the present disclosure, the active layer overlapping the first pattern electrode is configured to have semiconductive characteristic. A portion of the shield unit which is extended further than the first pattern electrode and exposed is configured to have a conductive characteristic.

According to still another feature of the present disclosure, the anode contact part of the second pattern electrode is connected with the shield unit and the output electrode.

According to still another feature of the present disclosure, the organic light emitting display device further includes a first shield capacitance between the patterned semiconductor layer and the first pattern electrode. The first shield capacitance varies on the basis of an image signal.

According to still another feature of the present disclosure, the organic light emitting display device further includes a data line. An edge of the second pattern electrode is further extended toward the data line than the first pattern electrode.

According to still another feature of the present disclosure, the organic light emitting display device further includes a data line. An edge of the patterned semiconductor layer is further extended toward the data line than the second pattern electrode.

According to still another feature of the present disclosure, the organic light emitting display device further includes a data line. An edge of the second pattern electrode is further extended toward the data line than the first pattern electrode but less extended than an edge of the patterned semiconductor layer.

According to still another feature of the present disclosure, the organic light emitting display device further includes a VDD line. The shield unit is electrically connected with the VDD line.

According to still another feature of the present disclosure, the shield unit is extended so as to overlap the VDD line.

According to still another feature of the present disclosure, the organic light emitting display device further includes a data line. The shield unit is configured such that a first shield capacitance is not generated between the first electrode and the shield unit and only a second shield capacitance is generated between the data line and the shield unit.

According to still another feature of the present disclosure, the shield unit is extended from the active layer along the data line such that an overlap area between the shield unit and the first electrode is minimized.

According to still another feature of the present disclosure, the organic light emitting display device further includes an input electrode connected with a data line and the active layer. A portion of the patterned semiconductor layer is extended toward the data line from the input electrode.

According to another aspect of the present disclosure to achieve the above-described objects, there is provided an organic light emitting display device including a shield unit; a driving thin film transistor; a storage capacitor; and a data line. The shield unit is electrically connected with a VDD line. The driving thin film transistor includes an input electrode, a gate electrode, and an output electrode, and is connected with the VDD line. The storage capacitor is disposed on the shield unit, and includes a first electrode connected with the gate electrode and a second electrode connected with the output electrode. An anode is disposed on the driving thin film transistor and the storage capacitor, and is connected with the second electrode. The data line is disposed to be adjacent to the shield unit as compared with the first electrode. At least a portion of the shield unit disposed to be adjacent to the data line is a conductor.

According to another feature of the present disclosure, a portion of the shield unit overlaps the data line; and the portion of the shield unit overlapping the data line is a conductor.

According to yet another feature of the present disclosure, the shield unit is connected with the input electrode of the driving thin film transistor and thus electrically connected with the VDD line.

According to still another feature of the present disclosure, the shield unit is connected with the output electrode of the driving thin film transistor and thus electrically connected with the VDD line through an active layer.

According to still another feature of the present disclosure, a predetermined area of the shield unit is a patterned semiconductor layer overlapping the first electrode. The predetermined area of the shield unit is configured to generate a capacitance which varies on the basis of a value of an image signal stored in the first electrode.

Details of other exemplary embodiments will be included in the detailed description of the invention and the accompanying drawings.

The present disclosure includes a shield unit overlapping a first electrode of a storage capacitor connected with a gate electrode of a driving thin film transistor. Thus, a capacitance of a parasitic capacitor formed by the first electrode of the storage capacitor and a data line can be reduced; and also a coupling effect generated between a gate voltage applied to the gate electrode of the driving thin film transistor and a data voltage applied to the data line can be reduced.

Further, the present disclosure includes the shield unit extended from an active layer of the driving thin film transistor. Thus, an additional process is not needed to reduce the capacitance of the parasitic capacitor.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1A:
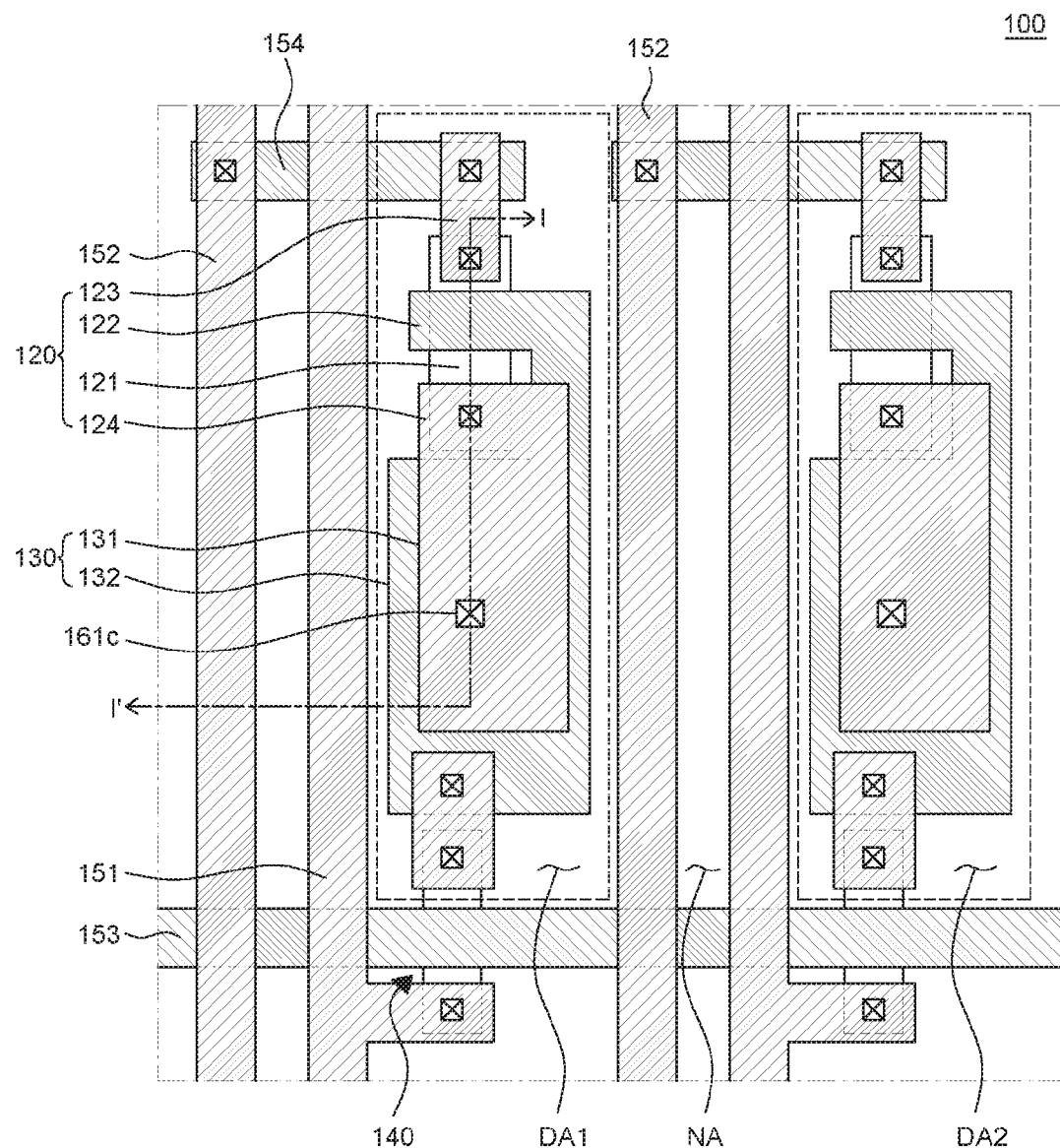
FIG. 1A is a schematic plane view illustrating a coupling effect caused by a parasitic capacitor in an organic light emitting display device of the prior art.
Figure 1B:
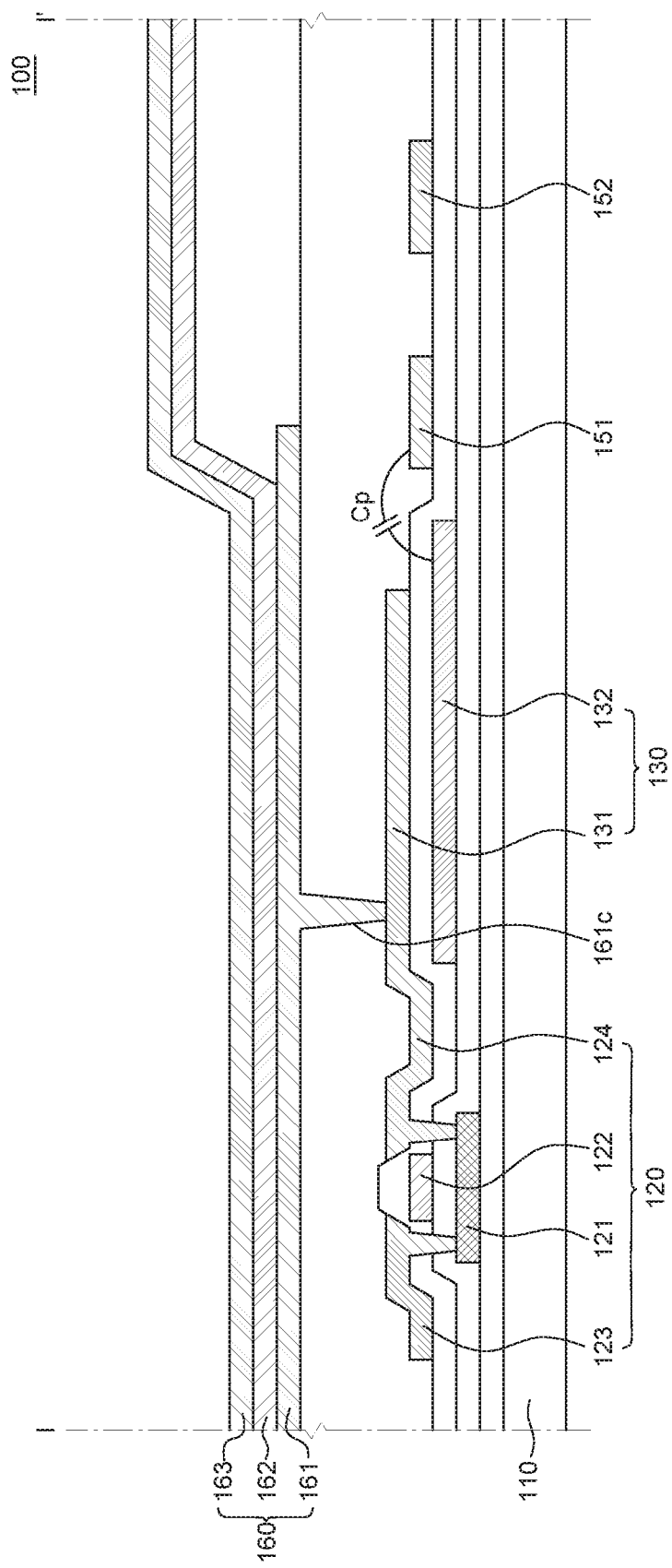
FIG. 1B is a schematic cross-sectional view taken along a line I-I' of FIG. 1A.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise. Components are interpreted to include an ordinary error range even if not expressly stated.

When the position relation between two parts is described using the terms such as "on", "above", "below", "next" and the like, one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements. Because a size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other. Various exemplary embodiments of the present disclosure will be described in detail with reference to the accompanying drawings.

Figure 2A:
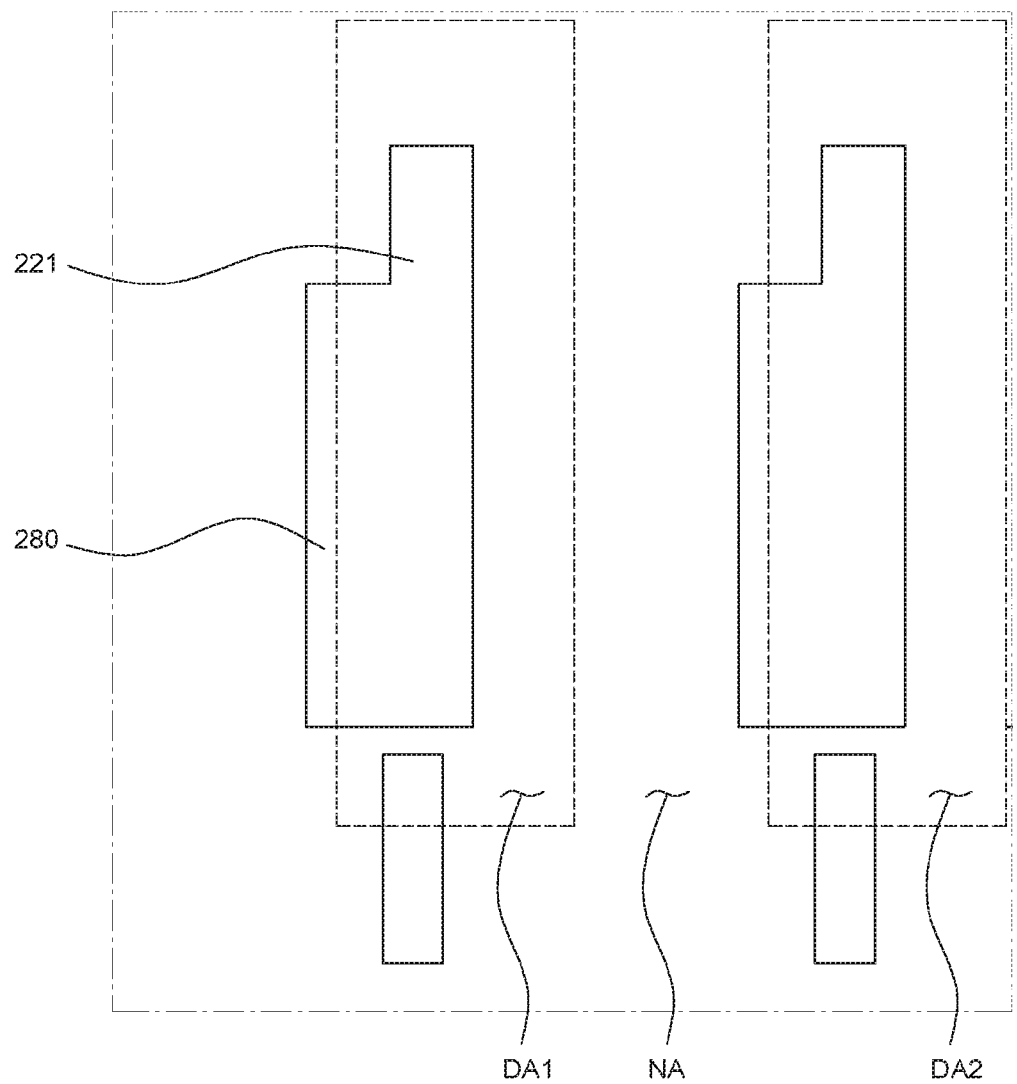
FIG. 2A to FIG. 2C are schematic plane views illustrating an organic light emitting display device according to an exemplary embodiment of the present disclosure.
Figure 2B:
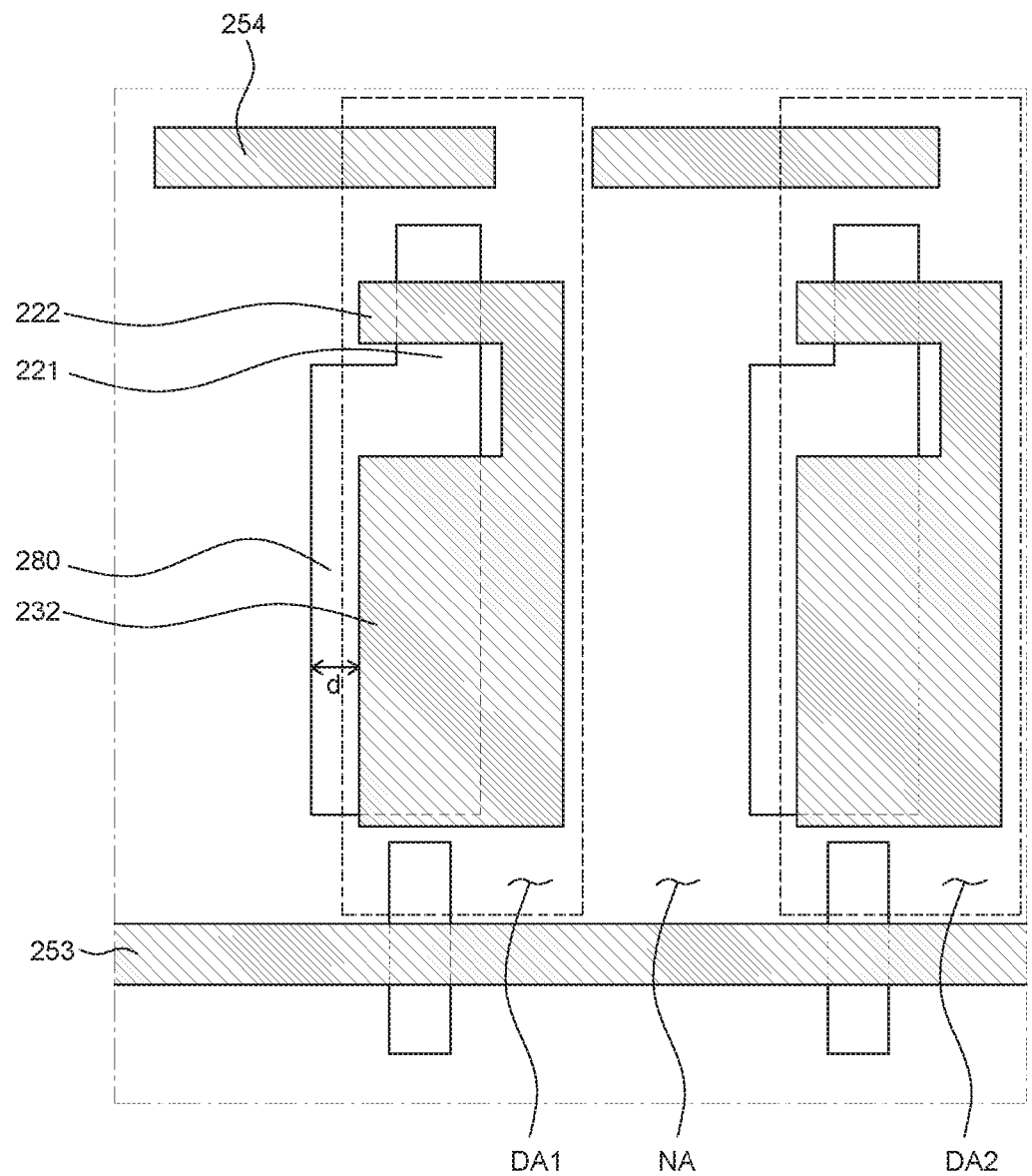
Figure 2C:
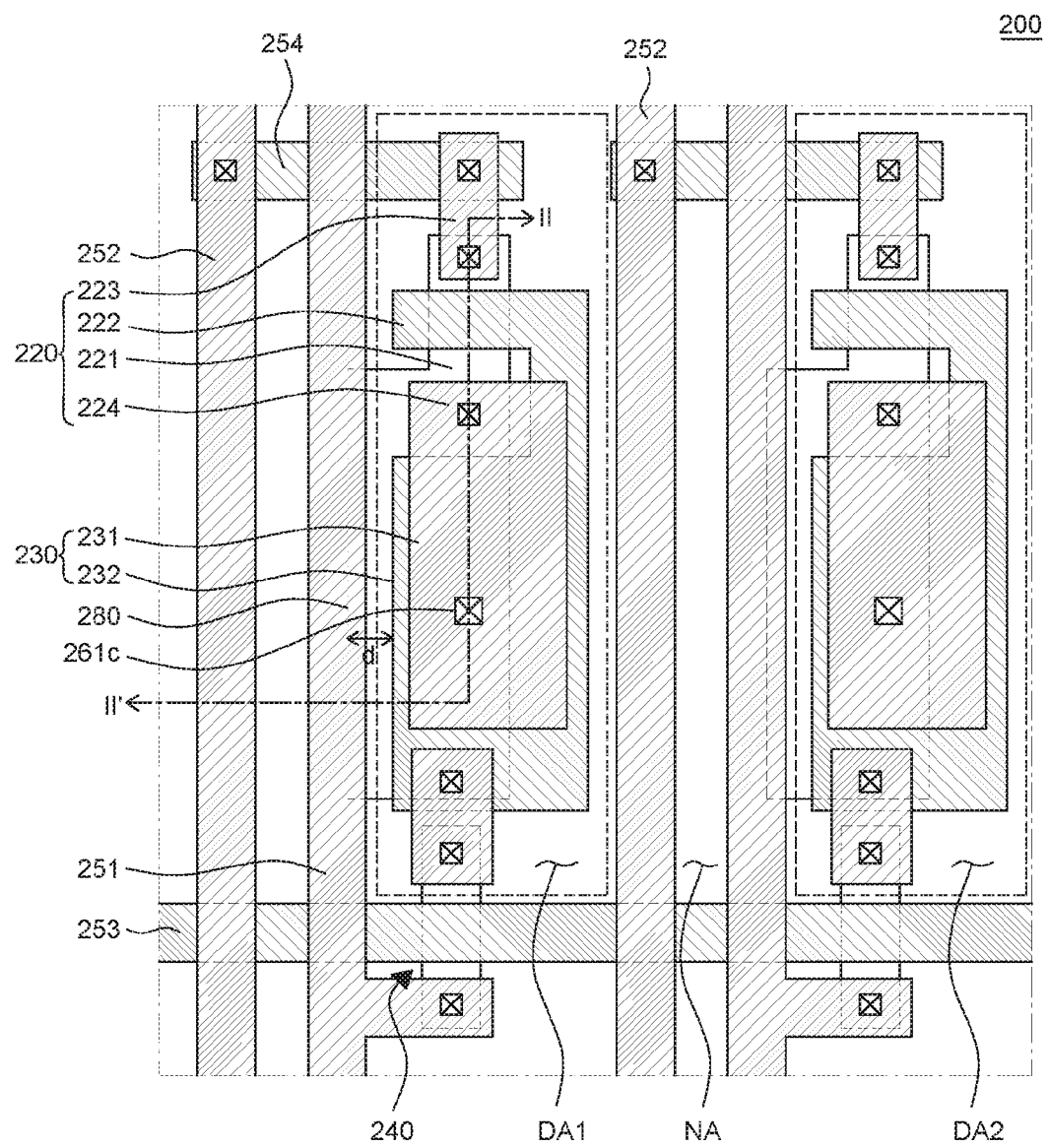
Figure 2D:
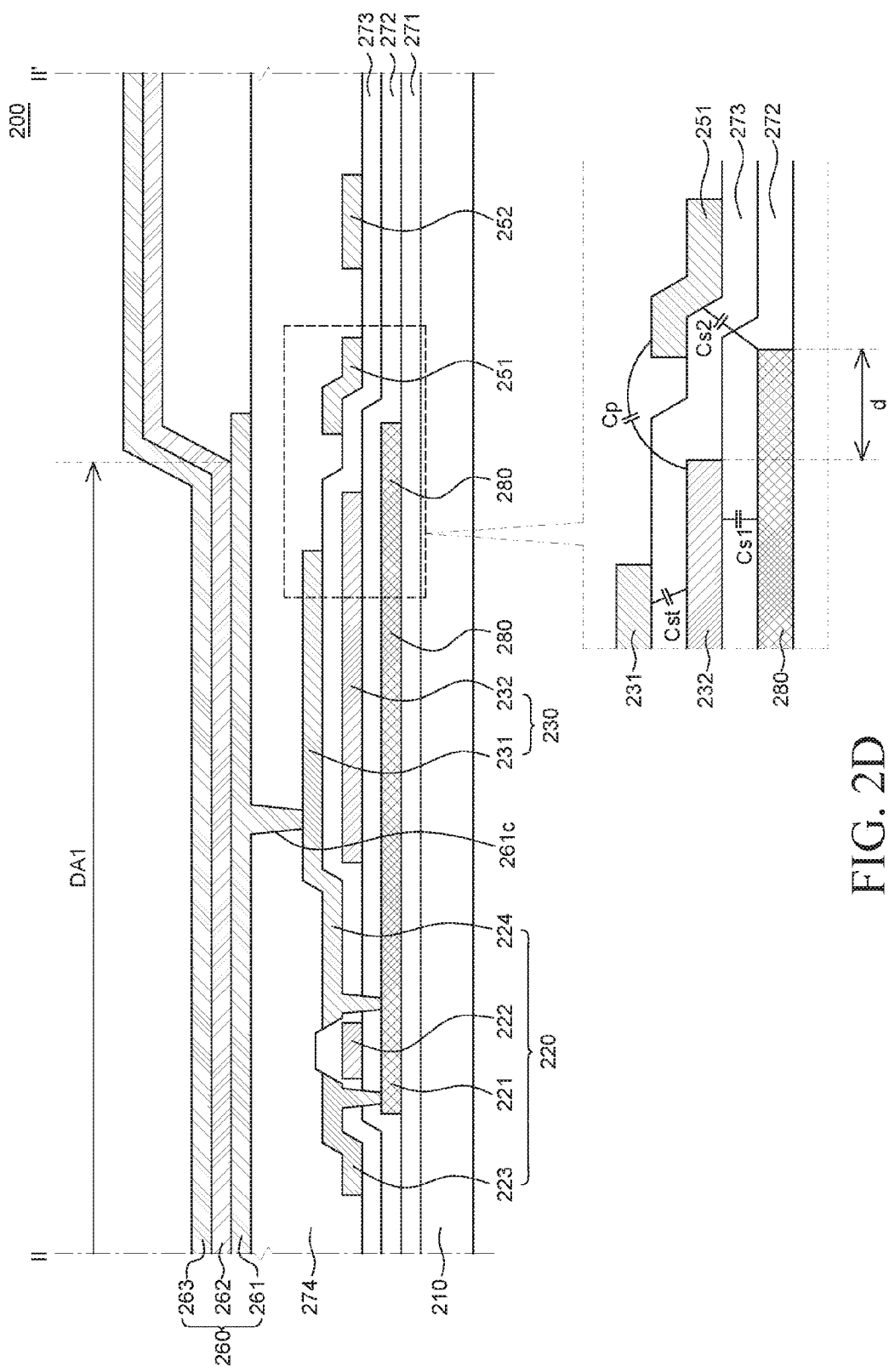
FIG. 2D is a schematic cross-sectional view taken along a line II-II' of FIG. 2C.

FIG. 2A to FIG. 2C are schematic plane views provided to describe an organic light emitting display device according to an exemplary embodiment of the present disclosure. FIG. 2D is a schematic cross-sectional view taken along a line II-II' of FIG. 2C. For convenience in explanation, FIG. 2A to FIG. 2C schematically illustrate two sub-pixels, and each of the sub-pixels includes two thin film transistors and one capacitor (hereinafter, this structure will be referred to as "2T1C structure"). However, in the present disclosure, the structure of the sub-pixel is not limited to the 2T1C structure, and each sub-pixel may be configured to have various additional compensation structures such as a 3T1C, a 4T2C, a 5T2C, a 6T2C, or a 7T2C. The additional compensation structures may include, for example, an initialization circuit configured to discharge a data voltage of a previous frame, a threshold voltage compensation circuit (Vth compensation circuit) configured to compensate a threshold voltage difference, or an emission control circuit configured to control an emission interval of an organic light emitting element 260.

An organic light emitting display device 200 according to an exemplary embodiment of the present disclosure may be an organic light emitting display device of a top emission type that emits a light emitted from an organic light emitting element 260 in an upward direction of a substrate 210, or an organic light emitting display device of a bottom emission type that emits a light emitted from the organic light emitting element 260 in a downward direction of the substrate 210. For convenience in explanation, each of FIG. 2A to FIG. 2D illustrates the organic light emitting display device 200 of the top emission type.

The organic light emitting display device 200 includes the substrate 210, a data line 251, a gate line 253, a VDD line 252, a switching thin film transistor 240, a storage capacitor 230, a driving thin film transistor 220, the organic light emitting display device 260, and a shield unit 280 (refer to FIG. 2D).

The substrate 210 is configured to support various components of the organic light emitting display device 200, and may be a glass substrate or a transparent plastic substrate having an excellent transmissivity. The substrate 210 includes a plurality of display areas DA1 and DA2 and a non-display area NA (refer to FIG. 2A to FIG. 2D). The display areas DA1 and DA2 are areas where the organic light emitting element 260 is disposed and an image is displayed, and may be referred to as pixel areas or sub-pixels. The non-display area NA refers to the other area than the display areas DA1 and DA2.

The data line 251 and the gate line 253 are disposed so as to intersect each other on the substrate 210 (refer to FIG. 2C). The data line 251 and the gate line 253 are disposed on the non-display area NA of the substrate 210; and areas defined by the data line 251 and the gate line 253 intersecting each other may be referred to as the display areas DA1 and DA2, but are not limited thereto. Although it has been described that the data line 251 and the gate line 253 have a straight shape, the data line 251 and the gate line 253 may have a diagonal, curve, or zigzag shape. That is, a shape of the data line 251 and gate line 253 is not limited.

Each of the driving thin film transistor 220 and the switching thin film transistor 240 includes an active layer, a gate electrode, an input electrode, and an output electrode, and may be a thin film transistor of a P-type semiconductor material or a thin film transistor of an N-type semiconductor material. An input electrode of an N-type thin film transistor (refer to FIG. 2C and FIG. 2D) may be referred to as a drain electrode and an output electrode may be referred to as a source electrode. Further, each of the driving thin film transistor 220 and the switching thin film transistor 240 may have a coplanar structure in which the gate electrode is disposed on the active layer or an inverted-staggered structure in which the gate electrode is disposed under the active layer. For convenience in explanation, the driving thin film transistor 220 and the switching thin film transistor 240 illustrated in FIG. 2C and FIG. 2D have a coplanar structure.

An input electrode of the switching thin film transistor 240 is connected with the data line 251 (refer to FIG. 2C). The input electrode of the switching thin film transistor 240 may be an extended part of the data line 251. However, the present disclosure is not limited to this shape of the input electrode of the switching thin film transistor 240.

The gate electrode of the switching thin film transistor 240 may be a portion of the gate line 253 and may also be disposed together with the gate line 253. A portion of the active layer of the switching thin film transistor 240 overlaps the gate line 253. Therefore, an area of the active layer overlapping the gate line 253 may be referred to as a gate electrode of the switching thin film transistor 240. That is, the gate electrode of the switching thin film transistor 240 may be a portion of the gate line 253. However, the present disclosure is not limited to this shape of the gate electrode of the switching thin film transistor 240.

The active layer of the switching thin film transistor 240 is formed of a semiconductor material. A portion of the active layer of the switching thin film transistor 240 overlaps the gate line 253. An output electrode of the switching thin film transistor 240 is connected with a first electrode 232. According to the above-described configuration, the switching thin film transistor 240 has a simple structure and thus can be efficiently disposed in a small space. That is, is has the structure suitable for the case where the organic light emitting display device 200 has a high resolution. If a turn-on voltage is applied to the gate line 253, a data voltage is supplied to the first electrode 232 through the switching thin film transistor 240 in order to store an image signal. If a turn-off voltage is applied to the gate line 253, the first electrode 232 is in a floating state in order to maintain a data voltage stored therein.

Referring to FIG. 2A to FIG. 2D, the storage capacitor 230 includes the first electrode 232 and a second electrode 231. The first electrode 232 of the storage capacitor 230 (hereinafter, referred to as "first electrode 232") is connected with the output electrode of the switching thin film transistor 240 and a gate electrode 222 of the driving thin film transistor 220. The first electrode 232 may function as a node that connects the gate electrode 222 of the driving thin film transistor 220 with the output electrode of the switching thin film transistor 240.

The opposite electrode 231 of the storage capacitor 230 (hereinafter, referred to as "second electrode 231") is connected with an output electrode 224 of the driving thin film transistor 220 and the organic light emitting element 260.

The driving thin film transistor 220 is an N-type thin film transistor, but is not limited thereto. The driving thin film transistor 220 includes an active layer 221, the gate electrode 222, an input electrode 223, and the output electrode 224. The active layer 221 of the driving thin film transistor 220 (hereinafter, referred to as "active layer 221") is formed of a semiconductor material. The gate electrode 222 of the driving thin film transistor 220 (hereinafter, referred to as "gate electrode 222") overlaps the active layer 221. The gate electrode 222 is configured to supply an electric field to the active layer 221 on the basis of a data voltage corresponding to a gray scale value stored in the storage capacitor 230. The electric field supplied by the gate electrode 222 to the active layer 221 enables the organic light emitting display device 200 to precisely control the conductivity of the active layer 221, and regulate an amount of a current to be supplied to the organic light emitting element 260. Therefore, if a voltage slightly fluctuates in the gate electrode 222, an image quality may deteriorate in an organic light emitting display device 200 without the shield unit 280.

The gate electrode 222 may be formed of the same metal as the first electrode 232. Further, the gate electrode 222 may be a part extended from the first electrode 222. Particularly, the gate electrode 222 and the first electrode 232 may be the same metal layer. The gate electrode 222 and first electrode 232 as a portion of the same patterned metal layer may be referred to as "first pattern electrode". That is, a portion of the first pattern electrode is configured to function as the first electrode 232 and another portion thereof is configured to function as the gate electrode 222. That is, the first pattern electrode may be configured to have a specific shape to perform the functions of the first electrode 232 and the gate electrode 222 at the same time.

The input electrode 223 of the driving thin film transistor 220 (hereinafter, referred to as "input electrode 223") is connected with the VDD line and a portion of the active layer 221 of the driving thin film transistor 220. The VDD line 252 is separated from the data line 251. The VDD line 252 is disposed at a distance from the data line 251, and configured to supply a driving current to the organic light emitting element 260. For example, the VDD line 252 may be connected with the input electrode 223 through a connection line 254 disposed under the VDD line 252. However, the input electrode 223 is not limited thereto, and may be connected without the connection line 254. The VDD line 252 may be formed of the same metal as the data line 251 on the same plane.

The output electrode 224 of the driving thin film transistor 220 (hereinafter, referred to as "output electrode 224") is connected with the second electrode 231, another portion of the active layer 221, and the organic light emitting element 260. The output electrode 224 is configured to transfer a current passing through the active layer 221 to the organic light emitting element 260. The output electrode 224 is formed of the same metal as the second electrode 231. To be specific, the output electrode 224 and the second electrode 231 may be the same metal layer. That is, the output electrode 224 may be a part extended from the second electrode 231. In other words, the output electrode 224 and second electrode 231 as a portion of the same patterned metal layer may be referred to as "second pattern electrode". That is, the second electrode includes a part configured to function as the output electrode 224 and another portion configured to function as the second electrode 231 of the storage capacitor 230. The second pattern electrode may further include an anode contact part 261c connected with the anode 261 of the organic light emitting element 260. That is, the second pattern electrode may be configured to have a specific shape to perform the functions of the storage capacitor 230, the output electrode 224, and the anode contact part 261c connected with the anode 261 at the same time. For example, the second electrode 231 may be formed of the same metal as the data line 251. For example, the anode contact part 261c may be disposed within an area where the second electrode 231 overlaps the first electrode 232. Particularly, according to the above-described configuration, the anode contact part 261c has the advantage of being connected with the anode 261 without increasing a size of the second electrode 231.

Therefore, the driving current supplied through the VDD line 252 is supplied to the organic light emitting element 260 through the input electrode 223, the active layer 221, the output electrode 224, and the anode contact part 261c. If the organic light emitting display device 200 is a high-resolution organic light emitting display device 200, it is necessary to arrange as many sub-pixels as possible in a limited area. Thus, a size of the display areas DA1 and DA2 may be decreased by disposing the first electrode 232 of the storage capacitor 230 adjacent to the data line 251. For example, the first electrode 232 may be separated from the data line 251 at a distance of about 8 µm or less. Further, the parasitic capacitance Cp may cause a sufficient coupling effect.

The shield unit 280 is disposed under the first electrode 232 of the storage capacitor 230, and a portion of the shield unit 280 overlaps a portion of the first electrode 232 (refer to FIG. 2B and FIG. 2D). The shield unit 280 is formed of the same material as the active layer 221. To be specific, the active layer 221 and the shield unit may be formed of the same semiconductor material. That is, the active layer 221 may be a portion extended from the shield unit 280. That is, the shield unit 280 is connected with the active layer 221. A portion of the semiconductor layer configured to function as the active layer 221 and a portion of the semiconductor layer configured to function as the shield unit 280 may be referred to as "patterned semiconductor layer". That is, the patterned semiconductor layer may include the active layer 221 and the shield unit 280. That is, the patterned semiconductor layer may be configured to have a specific shape to perform the functions of the active layer 221 and the shield unit 280.

Referring to FIG. 2B and FIG. 2D, although the shield unit 280 is formed of the semiconductor material, a portion of the shield unit 280 may have a conductive characteristic. Further, another portion thereof may maintain a semiconductive characteristic. To be specific, during a manufacturing process, the first pattern electrode may be used as a mask in a process for converting a semiconductor to a conductor. In this case, an area where the patterned semiconductor layer overlaps the first pattern electrode maintains the semiconductive characteristic. Meanwhile, an exposed area of the patterned semiconductor layer which is not covered by the first pattern electrode has the conductive characteristic.

For example, the patterned semiconductor layer may include silicon (Si), amorphous silicon, poly-silicon, and low temperature poly-silicon (LTPS). Further, the exposed area of the patterned semiconductor layer (refer to FIG. 2B) may be doped with a P-type dopant, such as boron, and thus made conductive.

For example, the patterned semiconductor layer may be an oxide semiconductor layer. As the oxide semiconductor, indium gallium zinc oxide (InGaZnO), indium tin zinc oxide (InSnZnO), indium zinc oxide (InZnO), tin zinc oxide (SnZnO), or the like may be used. Further, the exposed area of the patterned semiconductor layer (refer to FIG. 2B) may be made conductive through a plasma process.

For example, the patterned semiconductor layer may include both of the oxide semiconductor and low temperature poly-silicon. That is, a portion of the patterned semiconductor layer may be formed of the oxide semiconductor, and the other portion thereof may be formed of low temperature poly-silicon. In this case, an exposed area in the portion of the patterned semiconductor layer formed of the oxide semiconductor (refer to FIG. 2B) may be made conductive through a plasma process. An exposed area in the other portion of the patterned semiconductor layer formed of low temperature poly-silicon may be made conductive with a P-type dopant.

The shield unit 280 is disposed on a buffer layer 271 on the substrate 210. The buffer layer 271 suppresses infiltration of moisture or impurity through the substrate 210. The buffer layer 271 is not necessarily included. Thus, the buffer layer 271 may be omitted in some exemplary embodiments.

An edge of the shield unit 280 may be further protruded toward the data line 251 than an edge of the first electrode 232 of the storage capacitor 230. For example, assuming that the shield unit 280 and the first electrode 232 are aligned on the same plane, the edge of the shield unit 280 may be further protruded than the edge of the first electrode 232 of the storage capacitor 230 by a predetermined distance d (refer to FIG. 2D). For convenience in explanation, this distance is defined as a protrusion distance d. Although the edge of the shield unit 280 is illustrated as overlapping the data line 251 in FIG. 2D, the edge of the shield unit 280 may be positioned between an edge of an area where the first electrode 232 is disposed and an edge of an area where the data line 251 is disposed. That is, the protrusion distance d may be smaller than a distance between an edge of the first electrode 232 and an edge of the data line 251.

A gate insulation layer 272 is disposed on the shield unit 280. The shield unit 280 and the first electrode 232 of the storage capacitor 230 are insulated from each other, and the active layer 221 and the gate electrode 222 are insulated from each other, by the gate insulation layer 272. As the organic light emitting display device 200 is formed to be thin, the gate insulation layer 272 is formed to have a small thickness. For example, the gate insulation layer 272 may be formed to have a thickness of about 1000 Å (100 nm), but thickness of the gate insulation layer 272 is not limited thereto.

An interlayer insulation layer 273 is disposed so as to cover the gate electrode 222 and the first pattern electrode including the first electrode 232. The second electrode 231 connected with the output electrode 224 is disposed on the interlayer insulation layer 273, and the second electrode 231 and the first electrode 232 are insulated by the interlayer insulation layer 273. As the organic light emitting display device 200 is manufactured to have a small thickness, the interlayer insulating layer 273 is formed to have a small thickness. For example, the interlayer insulation layer 273 may be formed to have a thickness of about 4000 Å (400 nm), but the thickness of the interlayer insulation layer 273 is not limited thereto.

The input electrode 223 and the output electrode 224 are disposed on the interlayer insulation layer 273. For example, a contact hole is provided in the interlayer insulation layer 273 and the gate insulation layer 272, and the input electrode 223 and the output electrode 224 are connected with the active layer 221 through the contact hole.

A planarization layer 274 is disposed so as to cover the driving thin film transistor 220, and the organic light emitting element 260 is disposed on the planarization layer 274. The planarization layer 274 compensates a step height caused by the driving thin film transistor 220, the data line 251, the VDD line 252 and planarizes an upper surface of the substrate 210. The organic light emitting element 260 includes the anode 261, the organic light emission layer 262, and the cathode 263, and is disposed in a light emission area DA1. The anode 261 supplies a hole to the organic light emission layer 262, and the cathode 263 supplies an electron to the organic light emission layer 262. That is, the driving current transferred through the driving thin film transistor 220 flows from the anode 261 to the cathode 263 via the organic light emission layer 262. The cathode 263 may be electrically connected with a voltage supply pad unit disposed in a peripheral area of the substrate 210, and the voltage supply pad unit may apply a VSS voltage to the cathode 263.

Each of the data line 251 and the VDD line 252 is disposed on the interlayer insulation layer 273. As described above, each of the data line 251 and the first electrode 232 are disposed so as to be adjacent to each other. A distance between the first electrode 232 and the data line 251 is about 8 μm or the less as described above. Therefore, a coupling effect caused by the first electrode 232 and the data line 251 may be a non-negligible effect. Therefore, a capacitance is generated between the first electrode 232 and the data line 251, and is defined as a parasitic capacitance Cp. The parasitic capacitance Cp may be increased as the distance between the data line 251 and the first electrode 232 is decreased. An area where the first electrode 232 overlaps the second electrode 231 is defined as a storage capacitor Cst.

Likewise, the shield unit 280 and the first electrode 232 are separated from each other with the gate insulation layer 272 and have a small thickness therebetween. A capacitance is generated between the shield unit 280 and the first electrode 232. This capacitance is defined as a first shield capacitance Cs1. Further, the shield unit 280 and the data line 251 are separated from each other with the gate insulation layer 272 and the interlayer insulation layer 273 having small thickness therebetween. Thus, a capacitance is generated between the shield unit 280 and the data line 251. This capacitance is defined as a second shield capacitance Cs2.

The parasitic capacitance Cp formed between the data line 251 and the first electrode 232 may be decreased by the second shield capacitance Cs2 generated between the data line 251 and an area of the shield unit 280 extended toward the data line 251. An electric field is generated between the data line 251 and the extended area of the shield unit 280. Further, the electric field generated between the data line 251 and the extended area of the shield unit 280 causes a decrease in an electric field generated between the first electrode 232 and the data line 251. Therefore, the parasitic capacitance Cp is decreased. Otherwise, the extended area of the shield unit 280 may have a function of taking a part of the electric field generated between the first electrode 232 and the data line 251, as compared with an organic light emitting display device without including the shield unit 280.

Although the extended area of the shield unit 280 is formed of the semiconductor material, the extended area of the shield unit 280 is configured to have conductivity. Therefore, the extended area of the shield unit 280 may effectively take a part of the electric field generated toward the first electrode 232.

If a voltage of the first electrode 232 fluctuates, such fluctuation directly affects an amount of a current flowing toward the organic light emitting element 260. However, because the gate electrode 222 is electrically insulated from the shield unit 280, even if a voltage of the shield unit 280 fluctuates, such fluctuation does not directly affect a voltage of the electrically insulated gate electrode 222. That is, even if the second shield capacitance Cs2 is generated, an image quality does not deteriorate but the parasitic capacitance Cp is reduced. Therefore, the shield unit 280 can reduce crosstalk in the organic light emitting display device 200 and improve the luminance of the organic light emitting display device 200. Therefore, an image quality can be improved.

Particularly, the shield unit 280 is connected with the VDD line 252 that supplies a DC voltage through the active layer 221. Therefore, even if the second shield capacitance Cs2 is generated, a voltage value of the shield unit 280 is maintained in a relatively stable manner as compared with the first electrode 232. That is, a stable VDD voltage supplied through the VDD line 252 can minimize an effect of the second shield capacitance Cs2.

As described above, a coupling effect between the data line 251 and the first electrode 232 is decreased. Further, the parasitic capacitance Cp is also reduced. As a protruded area of the shield unit 280 is increased, the coupling effect between the data line 251 and the first electrode 232 may be effectively decreased. That is, as the protrusion distance d of the shield unit 280 is increased, the electric field generated between the first electrode 232 of the storage capacitor 230 and the data line 251 can be more effectively decreased and the parasitic capacitance Cp can be further decreased. For example, if a distance from the edge of the data line 251 to the edge of the first electrode 232 of the storage capacitor 230 is 6.5 μm and the shield unit 280 is not present, the capacitance of the parasitic capacitor Cp is 2.57 fF. On the other hand, when the shield unit 280 is disposed so as to overlap the first electrode 232 of the storage capacitor 230 and the protrusion distance d of the shield unit 280 is 0.5 μm, the capacitance of the parasitic capacitor Cp may be decreased to 1.27 fF. Further, if the protrusion distance d of the shield unit 280 is 6.5 μm, the capacitance of the parasitic capacitor Cp may be decreased to 0.52 fF.

The shield unit 280 includes the portion extended from the active layer 221. Further, the shield unit 280 may be electrically connected with the output electrode 224. Therefore, the first shield capacitance Cs1 and the second shield capacitance Cs2 are electrically connected with the output electrode 224. Further, when the driving thin film transistor 220 is turned on, the active layer 221 is made conductive and the output electrode 224 is electrically connected with the input electrode 223. Therefore, the first shield capacitance Cs1 and the second shield capacitance Cs2 are electrically connected with the VDD line 252 through the driving thin film transistor 220. In this case, because the VDD line is a stable voltage supply source, the first shield capacitance Cs1 and the second shield capacitance Cs2 are less affected by a coupling effect caused by the data line 251.

If the shield unit 280 is not provided, the first shield capacitance Cs1 and the second shield capacitance Cs2 are omitted and only the parasitic capacitance Cp is generated between the first electrode 232 and the data line 251.

Therefore, because the shield unit 280 is provided, the parasitic capacitance Cp may be decreased as compared with the case where the shield unit 280 is not provided.

Meanwhile, if the shield unit 280 is not extended from the active layer 221 of the driving thin film transistor 220 but formed into an island shape between the data line 251 and the first electrode 232, a coupling effect between the data line 251 and the gate electrode 222 may not be reduced. If the shield unit is formed into an island shape between the data line 251 and the first electrode 232, the island-shaped shield unit is in an electrically floated state. If the switching thin film transistor 240 is turned on, the first node electrode 232 is charged with a data voltage applied from the data line 251 and the first shield capacitance Cs1 is charged with the same data voltage. However, if the switching thin film transistor 240 is turned off during an emission interval, because the first shield capacitance Cs1 is in an electrically floated state, the voltage of the first electrode 232 cannot be maintained. Therefore, the voltage of the first electrode 232 is gradually decreased, and as a potential difference between the gate electrode 222 and the output electrode 224 is decreased, an amount of a driving current is decreased. Thus, even if there is a shield unit in a floating state, the luminance of the organic light emitting element 260 is decreased.

On the other hand, if the shield unit 280 according to an exemplary embodiment of the present disclosure is formed to be extended from the active layer 221 of the driving thin film transistor 220, the shield unit 280 may be connected with the input electrode 223 or the output electrode 224 of the driving thin film transistor 220 through the active layer 221 and electrically connected with the VDD line; and, thus, the first shield capacitance Cs1 and the second shield capacitance Cs2 are not electrically floated. In this case, the driving thin film transistor 220 can uniformly maintain an amount of a driving current. To be specific, because the first shield capacitor Cs1 during an emission interval is applied with a stable VDD voltage through the VDD line 252 and thus not electrically floated, the first shield capacitance Cs1 can maintain a potential difference between the VDD line 252 and the first electrode 232; and a voltage of the first electrode 232 is maintained by the first shield capacitance Cs1 and the storage capacitor 230. That is, the first shield capacitance Cs1 functions as another storage capacitor and thus maintains a turn-on state of the driving thin film transistor 220.

Further, the first shield capacitance Cs1 operates as a variable capacitance. Referring to FIG. 2B again, the shield unit 280 overlapping the first electrode 232 has a semiconductive characteristic. Therefore, as for the first shield capacitance Cs1, a capacitance volume varies based on a data voltage (e.g., an image signal) stored in the first electrode 232.

A variable capacitance has a greater volume when an image with a higher luminance is displayed. That is, if a higher data voltage is input to the first electrode 232, the conductivity of the semiconductor layer of the shield unit 280 overlapping the first electrode 232 is increased corresponding to a value of a data voltage stored in the first electrode 232. Otherwise, the electrical resistance is decreased corresponding to a value of a data voltage stored in the first electrode 232. Therefore, even if the gate electrode 222 of the driving thin film transistor 220 is coupled with the data line 251 by the parasitic capacitor Cp, the potential difference between the gate electrode 222 and the output electrode 224 of the driving thin film transistor 220 can be maintained by the two capacitors (that is, the storage capacitor 230 and the first shield capacitor Cs1) connected in parallel with the gate electrode 222. Therefore, as compared with the case where the shield unit 280 is not provided, the amount of the driving current can be uniformly maintained during an emission interval, and the luminance of the organic light emitting element 260 can be uniformly maintained.

As a result, in the organic light emitting display device 200 according to an exemplary embodiment of the present disclosure, because the shield unit 280 is electrically connected with the VDD line 252, the capacitance of the parasitic capacitor Cp formed by the data line 251 and the first electrode 232 of the storage capacitor 230 can be decreased. Further, even if a coupling effect occurs in the shield unit 280, a current holding ratio of the driving thin film transistor 220 can be improved. Therefore, an amount of the driving current flowing in the organic light emitting element 260 can be uniformly maintained; and the luminance of the organic light emitting element 260 can be uniformly maintained. Further, because the shield unit 280 is extended from the active layer 221 of the driving thin film transistor 220, an additional process for forming the shield unit 280 is not required. Thus, it is possible to easily manufacture the organic light emitting display device 200 in which a coupling effect between the data line 251 and the gate electrode 222 of the driving thin film transistor 220 is reduced.

Figure 2E:
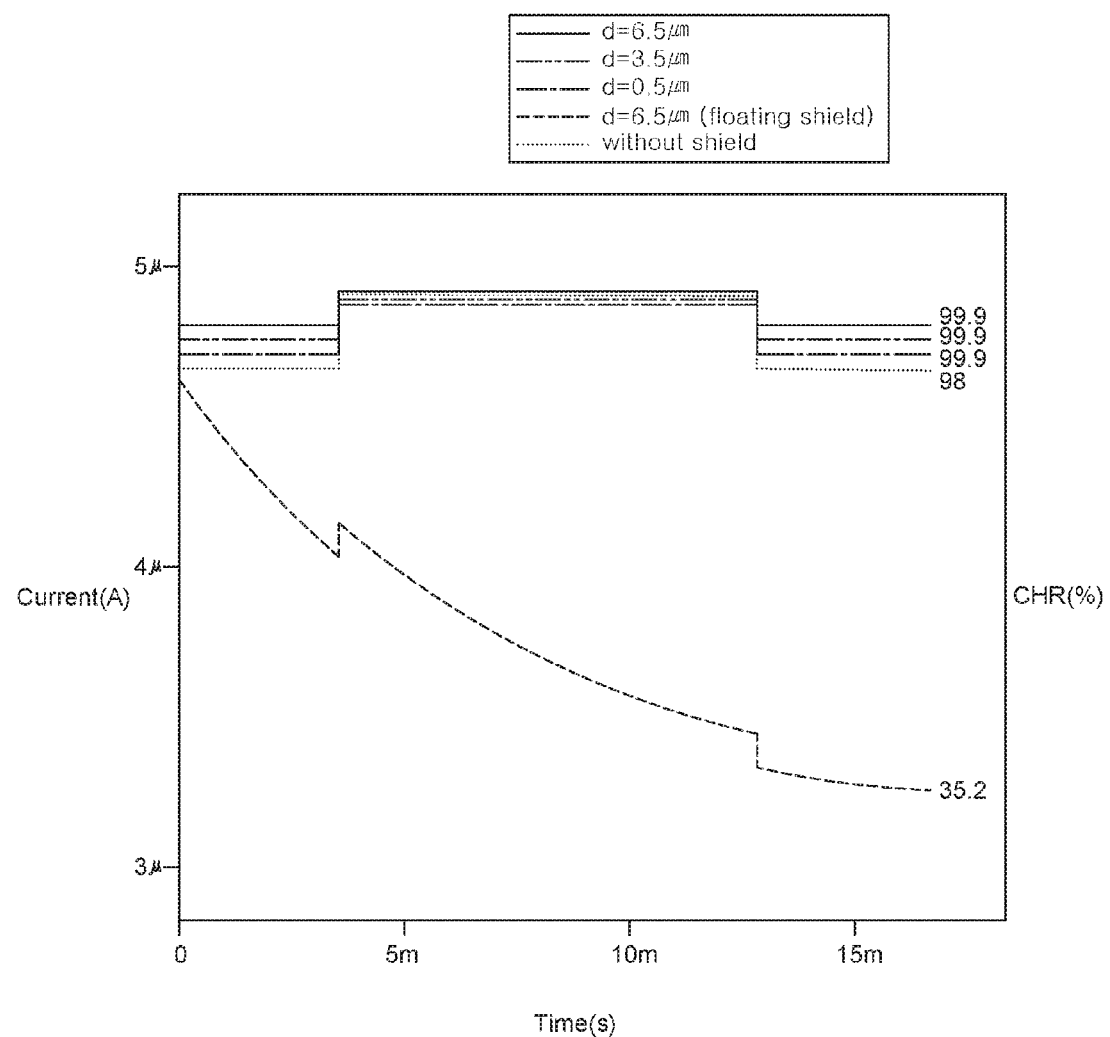
FIG. 2E is a graph provided to describe an effect of an organic light emitting display device according to an exemplary embodiment of the present disclosure

FIG. 2E is a graph provided to describe an effect of an organic light emitting display device according to an exemplary embodiment of the present disclosure. In FIG. 2E, d denotes a protrusion distance of the shield unit illustrated in FIG. 2D. FIG. 2E illustrates three Examples including a first Example (d=0.5 µm), a second Example (d=3.5 µm), and a third Example (d=6.5 µm); and two Comparative Examples including a first Comparative Example (d=6.5 µm (floating shield)), and a second Comparative Example (no shield). FIG. 2E shows a change, during an emission interval, in amount of a driving current flowing in an organic light emitting element of an organic light emitting display device according to an exemplary embodiment of the present disclosure. An amount of a current is proportional to the luminance of a sub-pixel.

In the graph of FIG. 2E, an x-axis represents a time on the basis of a starting point of time for an emission interval and a y-axis on the left represents an amount A of a driving current introduced into the anode of the organic light emitting element. A y-axis on the right represents a current holding ratio (CHR) of the driving current. The current holding ratio means a maintenance level of an amount of a current flowing in a sub-pixel during a period of 1 frame. In FIG. 2E, the period of 1 frame is 16.7 ms (60 Hz).

The first Comparative Example (d=6.5 µm (floating shield)) illustrates a change, during an emission interval, in amount of a driving current flowing in an organic light emitting element of an organic light emitting display device including a shield unit formed to be electrically floated. Herein, d denotes a protrusion distance d. The organic light emitting display device according to first Comparative Example is manufactured in the same manner as the organic light emitting display device according to a third Example except that the shield unit is formed into an island shape so as to be electrically floated. That is, the shield unit is not electrically connected with a VDD line.

A parasitic capacitance Cp generated between a data line and a first electrode in the first Comparative Example was measured as 0.53 fF. A crosstalk was measured as 4.3%. An initial amount of a current was measured as 4.7058 μA. A current holding ratio (CHR) was measured as 35.2%.

To be specific, an amount of a driving current is gradually decreased from 4.7058 μA. After 16.7 ms, the amount of the driving current is decreased to 1.656 μA.

In order to measure a crosstalk, a crosstalk pattern image including a white rectangular pattern at a central portion in a black background was displayed as a representative pattern for measuring a crosstalk on a display device. In the graph, it can be seen that an amount of a current is abruptly increased during an interval of from about 4 ms to about 13 ms. Such an increase in amount of a current is defined as a crosstalk phenomenon, and a degree of an increase in amount of a current is defined as a degree of crosstalk.

Accordingly, in the first Comparative Example, because the amount of the current is continually decreased, the luminance of the sub-pixel is continuously decreased. In the case of displaying an image in which crosstalk may occur, crosstalk occurs. Therefore, an image quality deteriorates. Particularly, it is preferable to set a current holding ratio to 98% or more and a crosstalk to 2% or less. Therefore, application of the first Comparative Example is not preferable.

The Comparative Example (no shield) illustrates a change, during an emission interval, in amount of a current flowing in an organic light emitting element of an organic light emitting display device without including a shield unit. In this case, because the shield unit is not present, a protrusion distance is not provided. The organic light emitting display device according to the second Comparative Example is manufactured in the same manner as the organic light emitting display device according to Example except that the shield unit is not provided.

In the second Comparative Example, a parasitic capacitance Cp generated between a data line and a first electrode was measured as 2.57 fF. A crosstalk was measured as 3.9%. An initial amount of a current was measured as 4.7197 μA. A current holding ratio (CHR) was measured as 98.0%.

To be specific, an amount of a driving current is gradually decreased from 4.7197 μA. After 16.7 ms, the amount of the driving current is decreased to 4.6253 μA.

In order to measure a crosstalk, a crosstalk pattern image including a white rectangular pattern at a central portion in a black background was displayed as a representative pattern for measuring a crosstalk on a display device.

Accordingly, in the second Comparative Example, because the amount of the current is continually decreased, the luminance of the sub-pixel is continuously decreased. In the case of displaying an image in which crosstalk may occur, crosstalk occurs. Therefore, an image quality deteriorates.

Particularly, it may be preferable to set a current holding ratio to 98% or more and a crosstalk to 2% or less.

The first Example (d=0.5 μm) illustrates a change, during an emission interval, in amount of a current flowing in the organic light emitting element 260 of the organic light emitting display device 200 including the shield unit 280 according to an exemplary embodiment of the present disclosure. In this case, d denotes a protrusion distance d. In the organic light emitting display device 200 according to the first Example, the protrusion distance d of the shield unit 280 is 0.5 μm. Further, the shield unit 280 is electrically connected with the VDD line 252.

In the first Example, a parasitic capacitance Cp generated between the data line 251 and the first electrode 232 was measured as 1.27 fF. A crosstalk was measured as 1.9%. An initial amount of a current was measured as 4.8222 μA. A current holding ratio (CHR) was measured as 99.9%.

To be specific, an amount of a driving current is continuously maintained at 4.8222 μA. After 16.7 ms, the amount of the driving current is decreased to 4.8173 μA.

In order to measure a crosstalk, a crosstalk pattern image including a white rectangular pattern at a central portion in a black background was displayed as a representative pattern for measuring a crosstalk on a display device. Accordingly, it can be seen that the driving current is almost uniformly maintained at about 4.7058 μA in the first Example. Because the amount of the current is continuously maintained, the luminance of the sub-pixel can be maintained. In the case of displaying an image in which crosstalk may occur, crosstalk of 2% or less occurs. Therefore, an image quality is improved as compared with Comparative Examples.

The second Example (d=3.5 μm) illustrates a change, during an emission interval, in amount of a current flowing in the organic light emitting element 260 of the organic light emitting display device 200 including the shield unit 280 according to an exemplary embodiment of the present disclosure. In this case, d denotes a protrusion distance d. In the organic light emitting display device 200 according to the second Example, the protrusion distance d of the shield unit 280 is 3.5 μm. Further, the shield unit 280 is electrically connected with the VDD line 252.

In the second Example, a parasitic capacitance Cp generated between the data line 251 and the first electrode 232 was measured as 0.88 fF. A crosstalk was measured as 1.3%. An initial amount of a current was measured as 4.8536 μA. A current holding ratio (CHR) was measured as 99.9%.

To be specific, an amount of a driving current is continuously maintained at 4.8536 μA. After 16.7 ms, the amount of the driving current is decreased to 4.8487 μA.

In order to measure a crosstalk, a crosstalk pattern image including a white rectangular pattern at a central portion in a black background was displayed as a representative pattern for measuring a crosstalk on a display device.

Accordingly, because the driving current is continuously maintained in the second Example, the luminance of the sub-pixel can be maintained. In the case of displaying an image in which crosstalk may occur, crosstalk of 2% or less occurs. Therefore, an image quality is improved as compared with the first Example. In particular, the crosstalk and the initial luminance are improved as compared with the first Example. Therefore, the second Example is preferred to the first Example.

The third Example (d=6.5 μm) illustrates a change, during an emission interval, in amount of a current flowing in the organic light emitting element 260 of the organic light emitting display device 200 including the shield unit 280 according to an exemplary embodiment of the present disclosure. In this case, d denotes a protrusion distance d. In the organic light emitting display device 200 according to the third Example, the protrusion distance d of the shield unit 280 is 6.5 μm. Further, the shield unit 280 is electrically connected with the VDD line 252.

In the third Example, a parasitic capacitance Cp generated between the data line 251 and the first electrode 232 was measured as 0.58 fF. A crosstalk was measured as 0.7%. An initial amount of a current was measured as 4.8822 μA. A current holding ratio (CHR) was measured as 99.9%.

To be specific, an amount of a driving current is continuously maintained at 4.8822 μA. After 16.7 ms, the amount of the driving current is decreased to 4.8773 μA.

In order to measure a crosstalk, a crosstalk pattern image including a white rectangular pattern at a central portion in a black background was displayed as a representative pattern for measuring a crosstalk on a display device. Accordingly, because the driving current is continuously maintained in the third Example, the luminance of the sub-pixel can be maintained. In the case of displaying an image in which crosstalk may occur, crosstalk of 2% or less occurs. Therefore, an image quality is improved as compared with Comparative Examples. In particular, it can be seen that the crosstalk and the initial luminance of the third Example are improved as compared with the second Example.

The reason why the amount of the driving current is uniformly maintained is that the shield unit is electrically connected with the input electrode or the output electrode of the driving thin film transistor and thus not electrically floated, as described above. To be specific, the shield unit uniformly maintains a potential difference between the gate electrode and the output electrode of the driving thin film transistor in substantially the same manner as the storage capacitor; and, thus, a current holding ratio of the driving thin film transistor can be improved. Further, as the protrusion distance is increased, a degree of crosstalk is improved. Thus, luminance of the organic light emitting element can be uniformly maintained and an image quality of the high-resolution organic light emitting display device can be improved.

Figure 3:
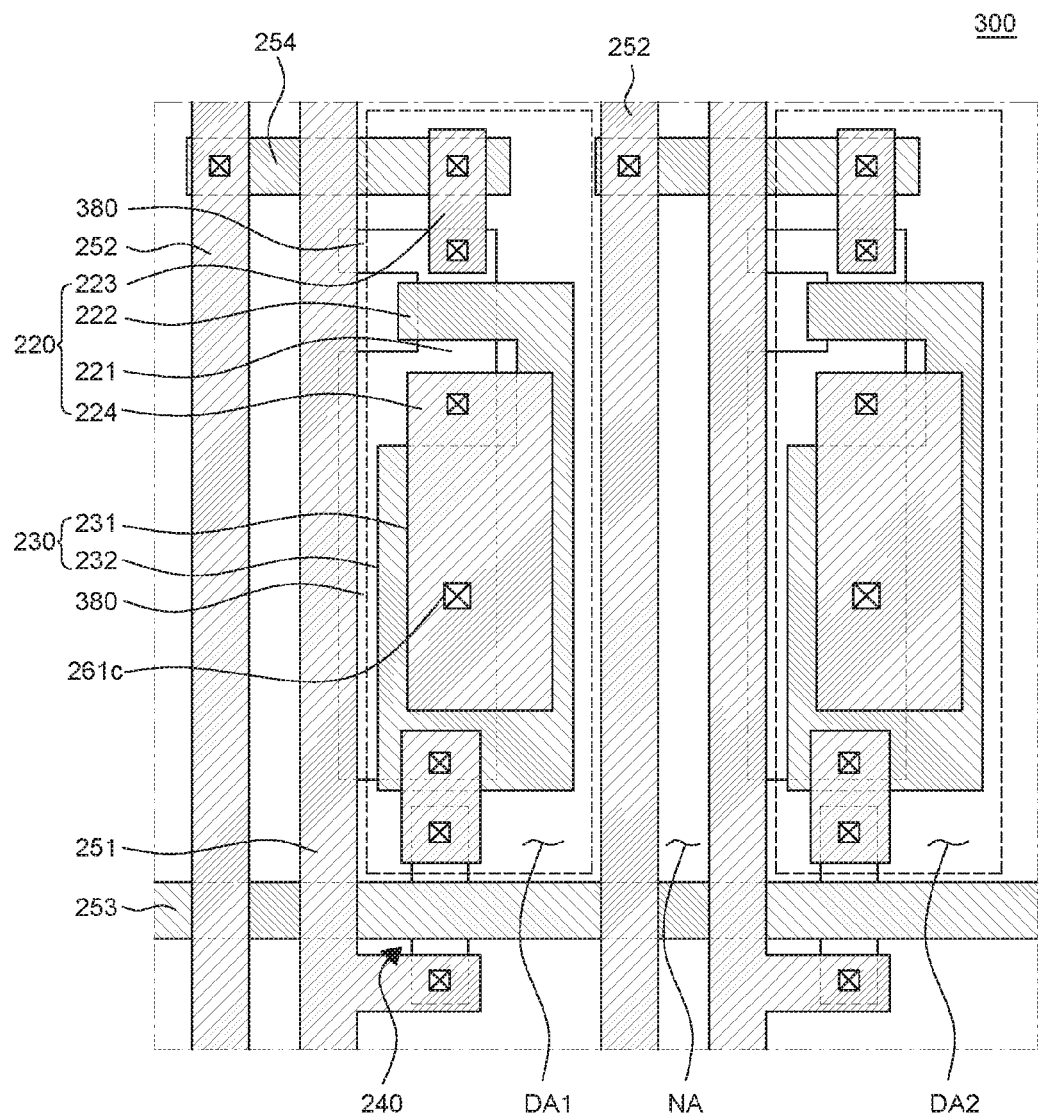
FIG. 3 is a schematic plane view illustrating an organic light emitting display device according to another exemplary embodiment of the present disclosure.

FIG. 3 is a schematic plane view provided to describe an organic light emitting display device according to another exemplary embodiment of the present disclosure. An organic light emitting display device 300 according to another exemplary embodiment of the present disclosure is characterized in that an additional shield unit 380 is extended toward the data line 251 from the active layer 221 corresponding to the input electrode 223 of the driving thin film transistor 230, as compared with the organic light emitting display devices according to the exemplary embodiments of the present disclosure as described above. Further, structural features of the organic light emitting display device 300 can be combined with the features of the organic light emitting display devices according to the exemplary embodiments of the present disclosure. Hereinafter, for convenience in explanation, redundant descriptions about the organic light emitting display device 200 will be omitted.

The shield unit 380 according to another exemplary embodiment of the present disclosure is configured to further include an area extended toward the data line 251 from the active layer 221 corresponding to the input electrode 223. For example, the shield unit 380 includes an area extended from the active layer 221 corresponding to input electrode 223 and configured to reduce a coupling effect between the data line 251 and the gate electrode 222; and an area extended from the active layer 221 corresponding to the output electrode 224 and configured to reduce a coupling effect between the data line 251 and the first electrode 232. That is, the shield unit 380 includes a plurality of shielding areas corresponding to the data line 251 (refer to FIG. 3).

That is, a portion of the patterned semiconductor layer (i.e., the active layer 221 of the shield unit 380) is extended toward the data line 251 from the input electrode 223. Each of the shielding areas of the shield unit 380 is configured to surround at least two surfaces of the gate electrode 222. However, in this case, each of the shielding areas of each shield unit 380 needs to be connected only through the active layer 221 of the driving thin film transistor 220 and is configured so as not to be connected with each other along the periphery of the driving thin film transistor 220. If each of the shielding areas is connected with each other along the periphery of the driving thin film transistor 220, a driving current supplied to the organic light emitting element 260 through the VDD line 252 may flow in a bypass path connected along the periphery of the driving thin film transistor 220. Therefore, the driving thin film transistor 220 may not operate.

The shielding areas of each shield unit 380 are configured to overlap the data line 251. Further, the shielding areas of each shield unit 380 have predetermined protrusion distances. Herein, the shielding areas of each shield unit 380 may have the same protrusion distance or different protrusion distances. Further, the shielding areas of each shield unit 380 may be or may not overlap the data line 251.

According to the above-described configuration, the shield unit 380 may reduce a coupling effect between the data line 251 and the gate electrode 222. Also, the shield unit 380 may reduce a coupling effect between the data line 251 and the first electrode 232.

Figure 4A:
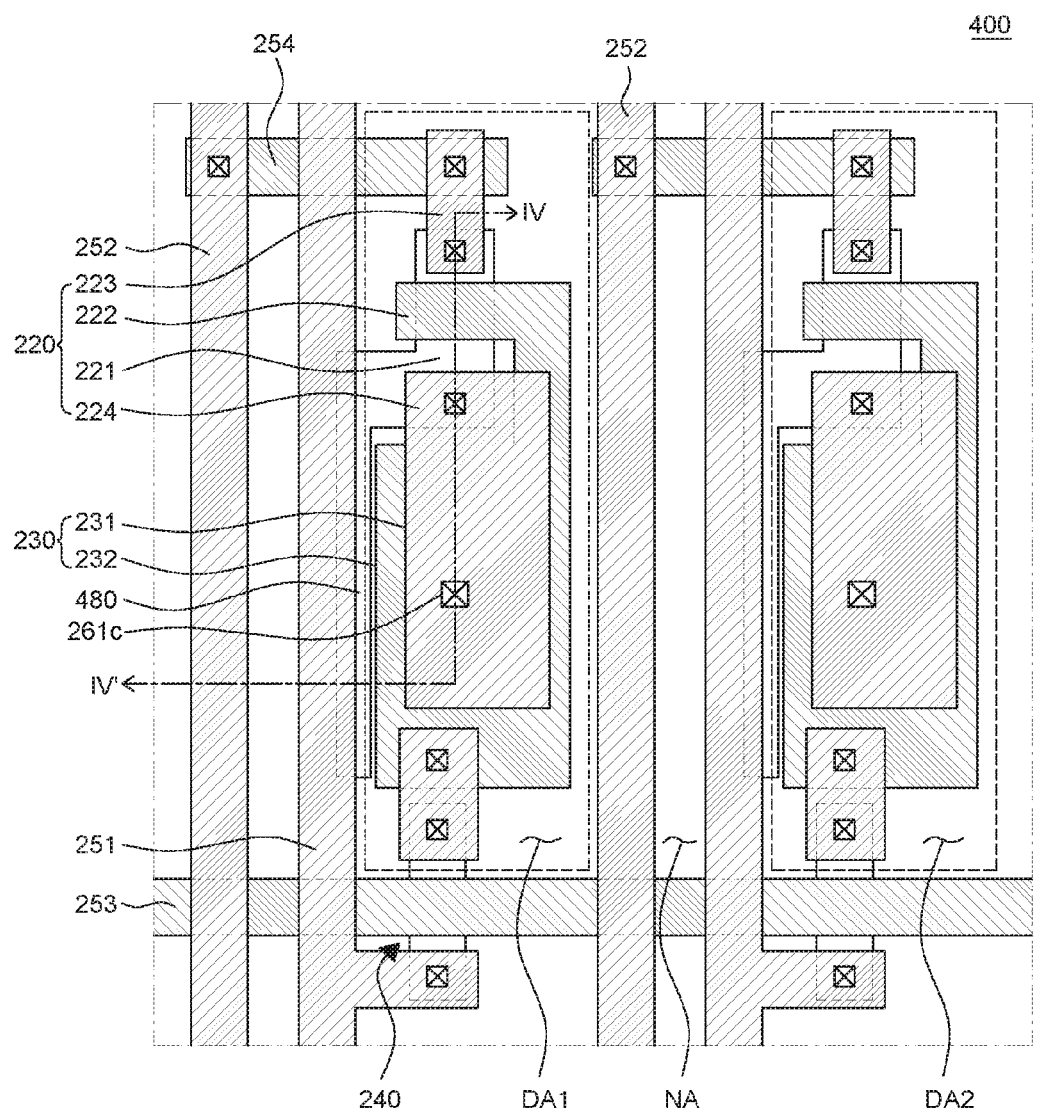
FIG. 4A is a schematic plane view illustrating an organic light emitting display device according to yet another exemplary embodiment of the present disclosure.
Figure 4B:
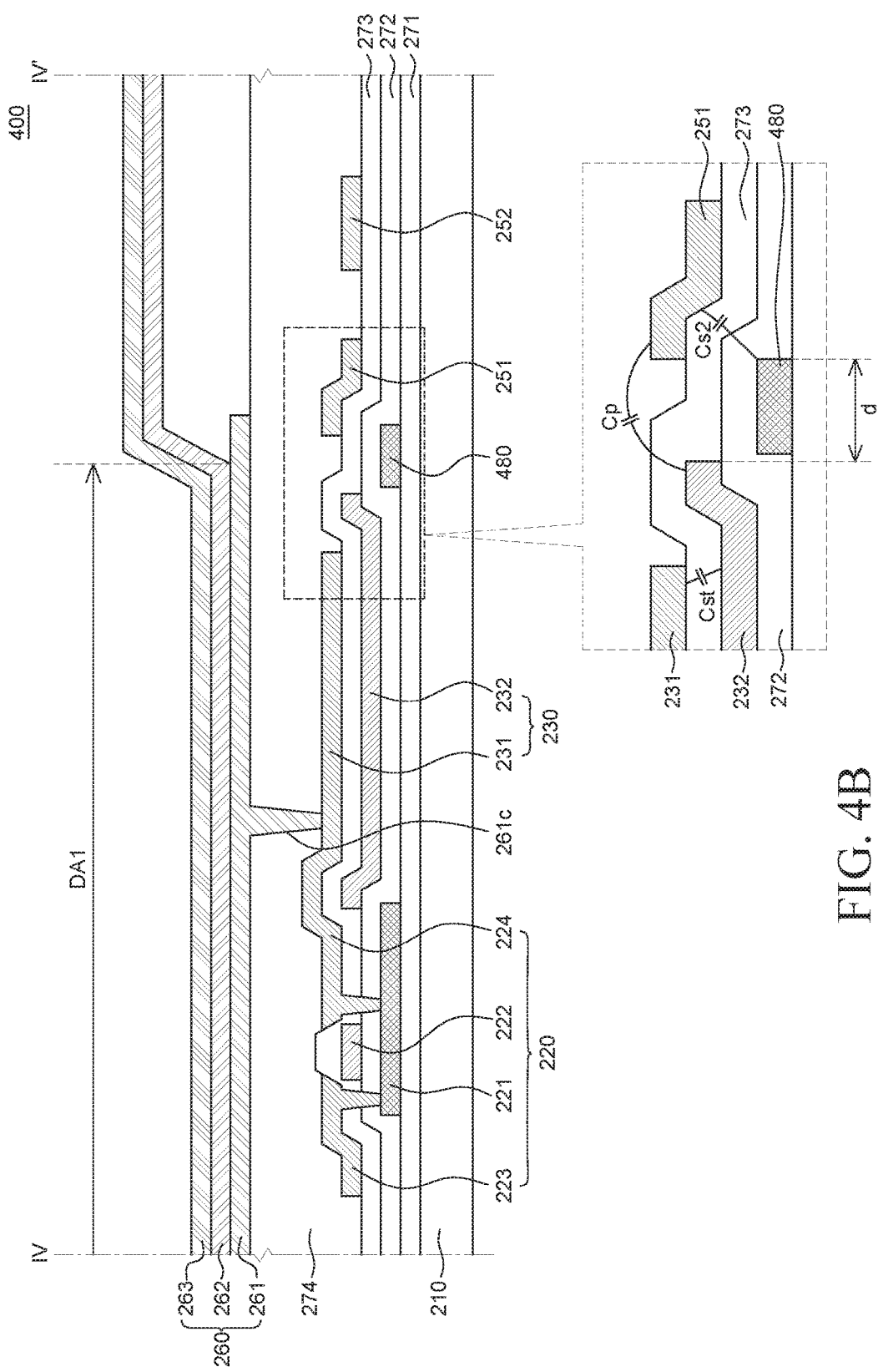
FIG. 4B is a schematic cross-sectional view taken along a line IV-IV' of FIG. 4A.

FIG. 4A and FIG. 4B are a schematic plane view and cross-sectional view, respectively, provided to describe an organic light emitting display device according to yet another exemplary embodiment of the present disclosure. An organic light emitting display device 400 according to yet another exemplary embodiment of the present disclosure is characterized in that an area where a shield unit 480 overlaps the first electrode 232 is minimized, as compared with the organic light emitting display devices according to the exemplary embodiments of the present disclosure. Thus, the first shield capacitance Cs1 is minimized. Further, structural features of the organic light emitting display device 400 can be combined with the features of the organic light emitting display devices according to the exemplary embodiments of the present disclosure. For example, the shield unit 480 may be combined with the shield unit 380 corresponding to the input electrode 223 of the already described organic light emitting display device 300, and may be combined with a shield unit 580 corresponding to the VDD line 252 of an organic light emitting display device 500 to be described later. Hereinafter, for convenience in explanation, redundant descriptions about the organic light emitting display devices 200 and 300 will be omitted.

The shield unit 480 according to yet another exemplary embodiment of the present disclosure is configured to be extended toward the data line 251 from the active layer 221 corresponding to the output electrode 224 and also configured to include a minimized area overlapping the first electrode 232 (refer to FIG. 4A and FIG. 4B).

For example, the shield unit 480 includes a minimized area overlapping the first electrode 232 and is extended along the data line 251. To be specific, preferably, an overlap distance between the shield unit 480 and the first electrode 232 in one direction may be at least 3 μm or less.

For example, the shield unit 480 may be extended along the data line 251 while overlapping the data line 251 but not overlapping the first electrode 232. To be specific, the shield unit 480 may not overlap the first electrode 232 in one direction, and may be separated from each other.

According to the above-described configuration, the shield unit 480 may reduce a coupling effect between the data line 251 and the first electrode 232. Also, the shield unit 480 may minimize an increase in the first shield capacitance Cs1. Particularly, if the storage capacitor Cst and the first shield capacitance Cs1 have sufficient volumes in a low-resolution organic light emitting display device, a time of charging the storage capacitor Cst and the first shield capacitance Cs1 with a data voltage may be increased. However, the shield unit 480 may compensate for the increase in the time of charging the storage capacitor Cst and the first shield capacitance Cs1 with the data voltage.

Further, an organic light emitting display device driven at a high speed, for example, an organic light emitting display device driven at 240 Hz and 480 Hz has a shorter emission interval. Therefore, it is necessary to charge the storage capacitor Cst with a data voltage. During a high-speed driving, the first shield capacitance Cs1 of the shield unit 480 is considerably smaller than the storage capacitance Cst or negligible; therefore, the shield unit 480 may not slow a charging speed of the storage capacitor Cst; also, the shield unit 480 may reduce a coupling effect between the data line 251 and the first electrode 232.

Figure 5:
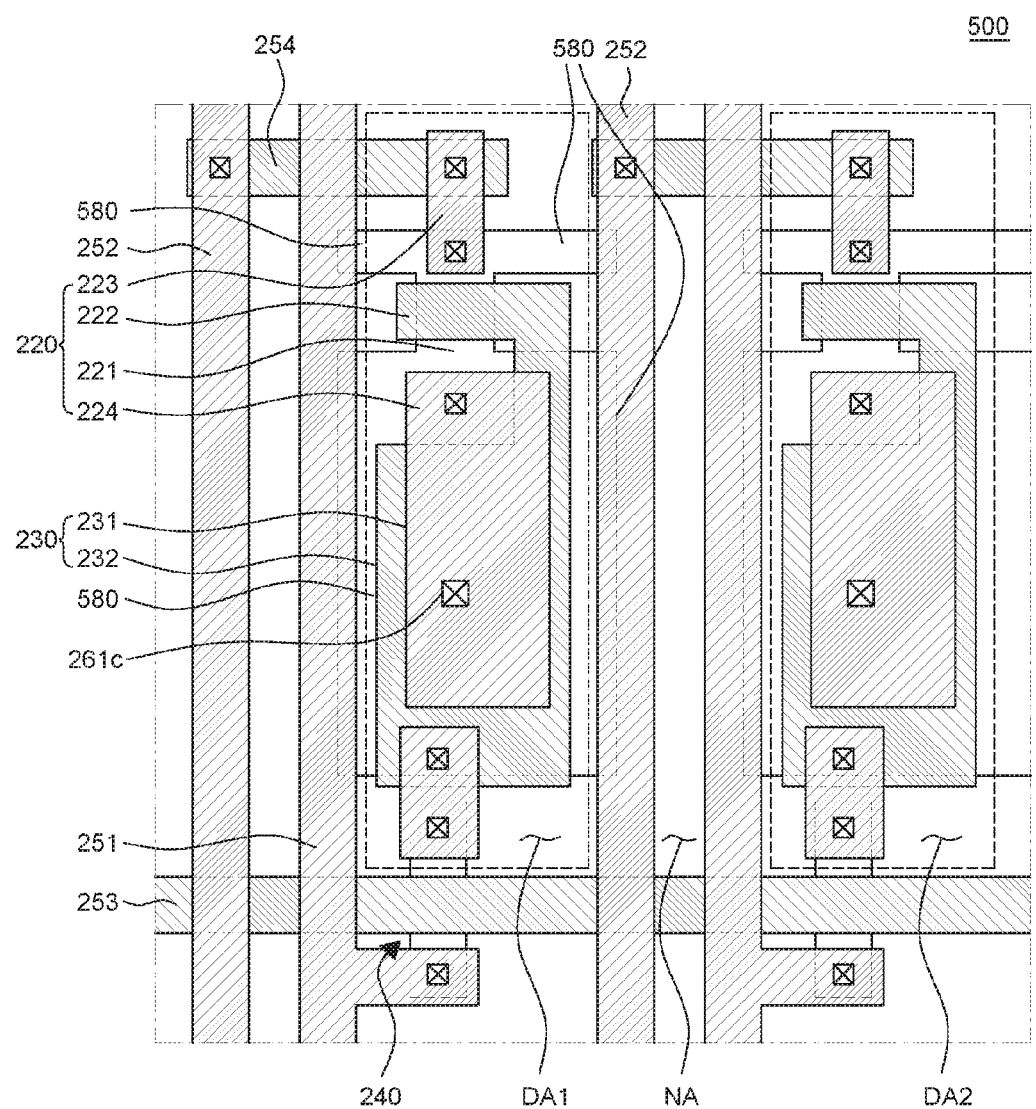
FIG. 5 is a schematic plane view illustrating an organic light emitting display device according to still another exemplary embodiment of the present disclosure.

FIG. 5 is a schematic plane view provided to describe an organic light emitting display device according to still another exemplary embodiment of the present disclosure. An organic light emitting display device 500 according to still another exemplary embodiment of the present disclosure is characterized in that an additional shield unit 580 is further extended toward the VDD line 252, as compared with the organic light emitting display devices according to the exemplary embodiments of the present disclosure. Further, structural features of the organic light emitting display device 500 can be combined with the features of the organic light emitting display devices according to the exemplary embodiments of the present disclosure. Hereinafter, for convenience in explanation, redundant descriptions about the organic light emitting display devices 200, 300, and 400 will be omitted.

The shield unit 580 according to still another exemplary embodiment of the present disclosure is configured to further include an area extended toward the VDD line 252. That is, the shield unit 580 includes an area configured to reduce a coupling effect between the data line 251 and the first electrode 232 and an area configured to reduce a coupling effect between the VDD line 252 and the first electrode 232. That is, the shield unit 580 includes a plurality of shielding areas corresponding to the data line 251 and VDD line 252 (refer to FIG. 5).

A shielding area of the shield unit 580 corresponding to the data line 251 and a shielding area of the shield unit 580 corresponding to the VDD line 252, the shielding area being extended from the active layer 221, may include areas configured to reduce a coupling effect between the data line 251 and the gate electrode 222 and a coupling effect between the VDD line 252 and the gate electrode 222. Otherwise, the shielding area of the shield unit 580 corresponding to the data line 251 and the shielding area of the shield unit 580 corresponding to the VDD line 252, the shielding area being extended from the active layer 221, may include an area configured to reduce a coupling effect between the data line 251 and the first electrode 232 and a coupling effect between the VDD line 252 and the first electrode 232.

Alternatively, the shielding area of the shield unit 580 corresponding to the data line 251 and the shielding area of the shield unit 580 corresponding to the VDD line 252, the shielding area being extended from the active layer 221, may include an area configured to reduce a coupling effect between the data line 251 and the gate electrode 222, a coupling effect between the data line 251 and the first electrode 232, a coupling effect between the VDD line 252 and the gate electrode 222, and a coupling effect between the VDD line 252 and the first electrode 232. That is, the shield unit 580 includes a plurality of shielding areas corresponding to at least each of the data line 251 and the VDD line 252.

Further, each of the shielding areas of each shield unit 580 has a predetermined protrusion distance. Herein, the shielding areas of each shield unit 580 may have the same protrusion distance or different protrusion distances. Further, the shielding areas of each shield unit 580 may be or may not overlap the data line 251 and/or the VDD line 252.

According to the above-described configuration, the shield unit 580 may reduce a coupling effect of the gate electrode 222 caused by the data line 251 and the VDD line 252. Also, the shield unit 580 may reduce a coupling effect of the first electrode 222 caused by the data line 251 and the VDD line 252. Further, according to the above-described configuration, as an overlap area between the shield unit 580 and the first electrode 232 is increased, the first shield capacitance Cs1 may be increased. Particularly, in a high-resolution organic light emitting display device, if an area for the storage capacitor Cst is not sufficient, the first shield capacitance Cs1 may be increased to compensate for a lack of a volume of the storage capacitor Cst in the high-resolution organic light emitting display device and reduce a coupling effect caused by the data line 251 and the VDD line 252.

Figure 6A:
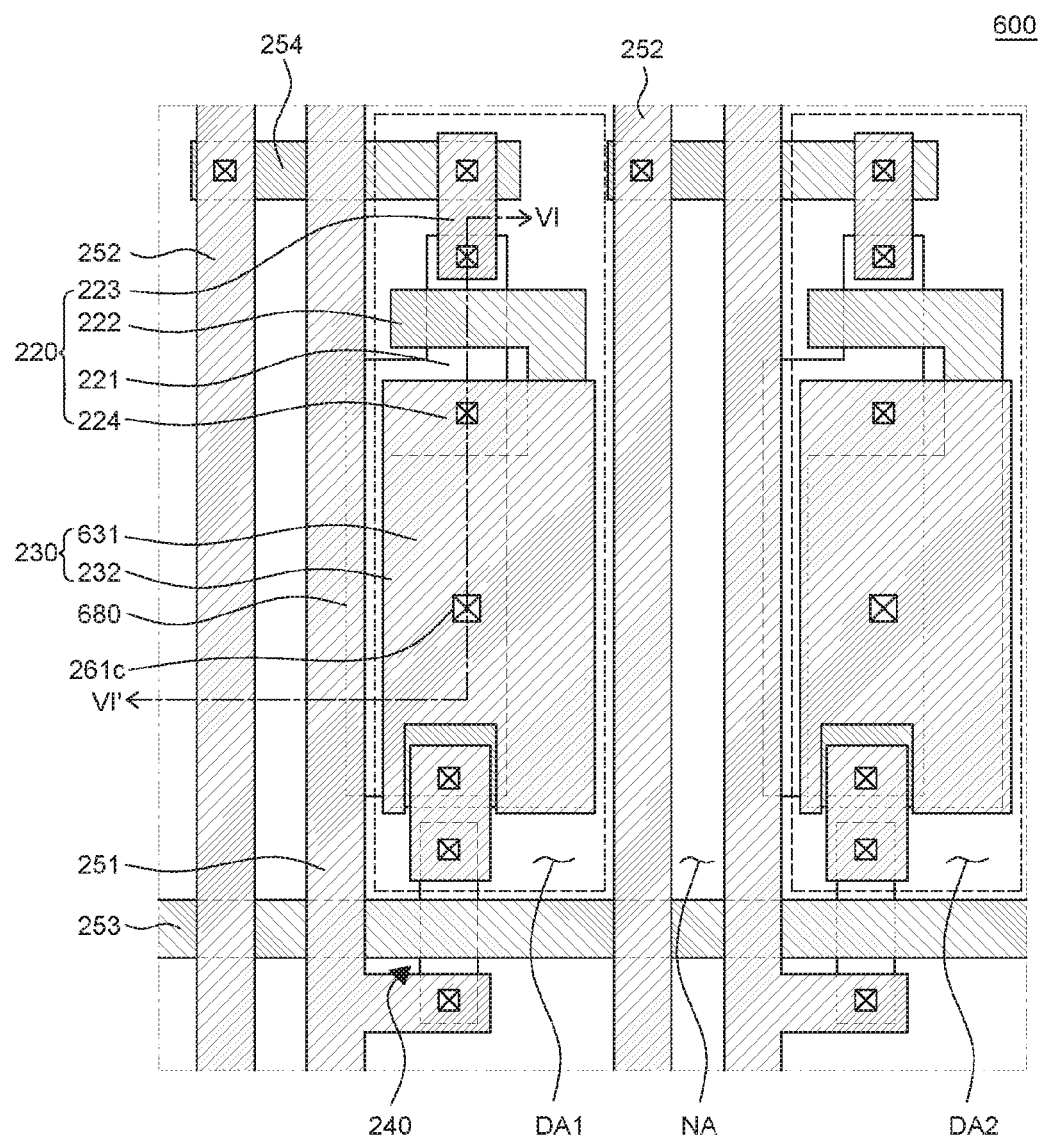
FIG. 6A is a schematic plane view illustrating an organic light emitting display device according to still another exemplary embodiment of the present disclosure.
Figure 6B:
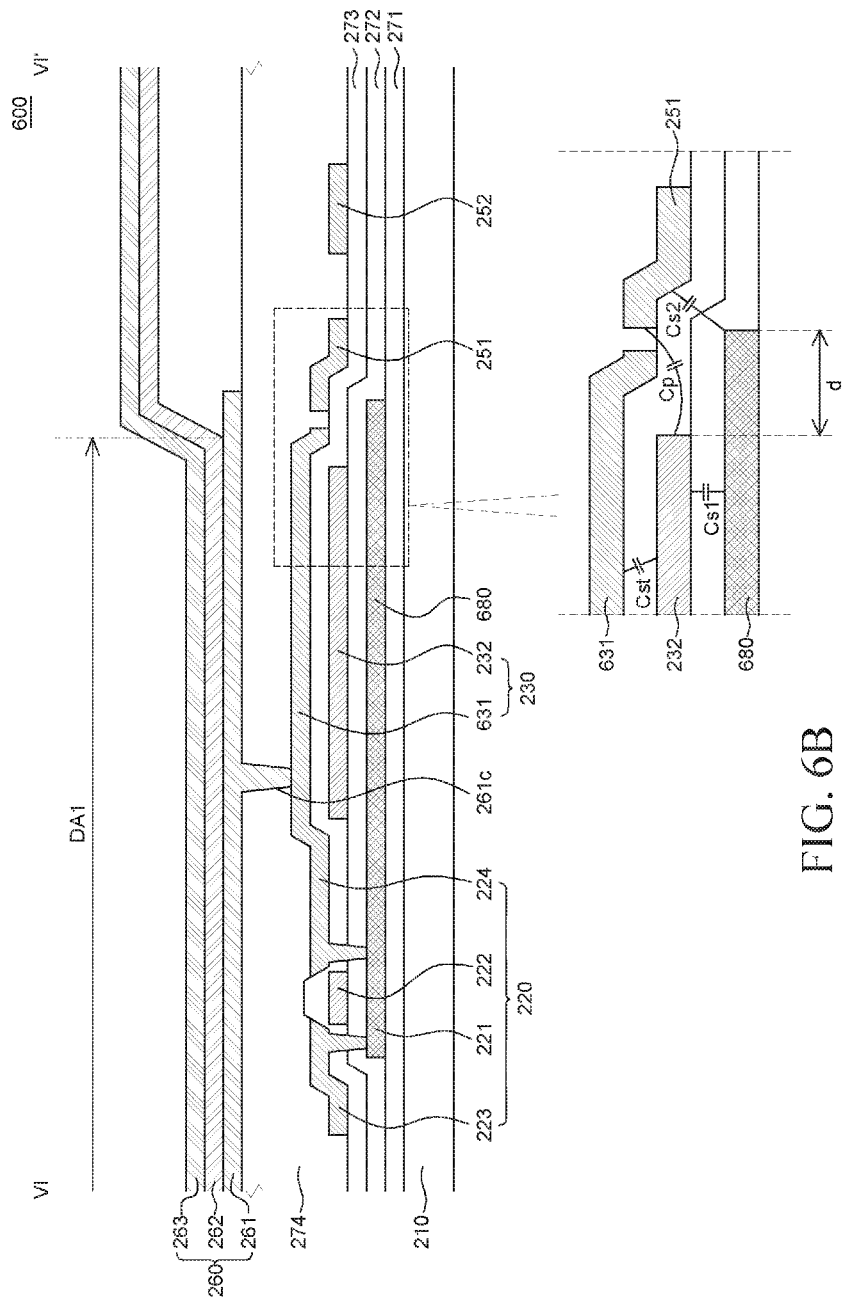
FIG. 6B is a schematic cross-sectional view taken along a line VI-VI' of FIG. 6A.

FIG. 6A and FIG. 6B are schematic plane view and cross-sectional view, respectively, provided to describe an organic light emitting display device 600 according to still another exemplary embodiment of the present disclosure. the organic light emitting display device 600 is characterized in that a second electrode 631 performs a function of an auxiliary shield unit, as compared with the organic light emitting display devices according to the exemplary embodiments of the present disclosure. Further, structural features of the organic light emitting display device 600 can be combined with the features of the organic light emitting display devices according to the exemplary embodiments of the present disclosure. Hereinafter, for convenience in explanation, redundant descriptions about the organic light emitting display devices 200, 300, 400, and 500 will be omitted.

The second electrode 631 covers an edge of the first electrode 232. To be specific, an edge of the second electrode 631 is positioned between an edge of the first electrode 232 and an edge of the data line 251. Further, the edge of the second electrode 631 is further protruded than the edge of the first electrode 232 (refer to FIG. 6A and FIG. 6B). In this case, the second electrode 631 together with a shield unit 680 blocks an electric field generated between the first electrode 232 and the data line 251. Thus, the parasitic capacitance Cp formed between the first electrode 232 and the data line 251 may be decreased.

In addition, generally, as a distance between the second electrode 631 and the data line 251 is decreased, a coupling effect between the second electrode 631 and the data line 251 is increased. However, the second electrode 631 of the organic light emitting display device 600 is intentionally disposed to be close to the data line 251. According to the above-described configuration, a coupling between the second electrode 631 and the data line 251 may be increased whereas a coupling effect between the first electrode 232 and the data line 251 may be decreased at the same time. In this case, the second electrode 631 is configured to be connected with the VDD line 252 through the driving thin film transistor 220. Thus, the second electrode 631 is less affected by a coupling effect than the first electrode 232 in a floating state. Therefore, even if the data line 251 and the second electrode 631 are close to each other, the second electrode 631 may stably perform a function of the auxiliary shield unit.

Further, the second electrode 631 may be further extended toward the VDD line positioned opposite to the data line 251 around the second electrode 631 (refer to FIG. 6A). In this case, the second electrode 631 covers the other edge on the opposite side of the edge of the first electrode 232. To be specific, the other edge of the second electrode 631 is positioned between the other edge of the first electrode 232 and an edge of the VDD line 252. Further, the other edge of the second electrode 631 is further protruded than the other edge of the first electrode 232. In this case, the second electrode 631 partly blocks an electric field generated between the first electrode 232 and the VDD line 252. Thus, a parasitic capacitance formed between the first electrode 232 and the VDD line 252 may be decreased. That is, as the parasitic capacitance Cp is decreased by the second electrode 231, a coupling effect between the gate electrode 222 of the driving thin film transistor 220 and the data line 251 may be decreased.

Further, the second electrode 631 may be further configured to maximize an area overlapping the first electrode 232. Particularly, according to the shape of the second electrode 631 described above, it is possible to decrease the parasitic capacitance Cp while increasing a volume of the storage capacitor Cst. For example, if the edge of the second electrode 631 is further protruded than the edge of the first electrode 232 so as to be close to the data line 251, an overlap area between the first electrode 232 and the second electrode 631 may be increased. Thus, a volume of the storage capacitor Cst may be increased. For example, if the other edge of the second electrode 631 is further protruded than the other edge of the first electrode 232 so as to be close to the VDD line 252, an overlap area between the first electrode 232 and the second electrode 631 may be increased. Thus, a volume of the storage capacitor Cst may be increased. For example, if the second electrode 631 is configured to surround the periphery of the output electrode of the switching thin film transistor 240, an overlap area between the first electrode 232 and the second electrode 631 may be increased. Thus, a volume of the storage capacitor Cst may be increased.

According to the above-described configuration, a volume of the storage capacitor Cst may be increased. Particularly, in a high-resolution organic light emitting display device, if an area for the storage capacitor Cst is not sufficient, it is possible to secure a volume of the storage capacitor Cst and also possible to reduce a coupling effect between the first electrode 232 and the data line 251 and/or the VDD line 252.

Figure 7A:
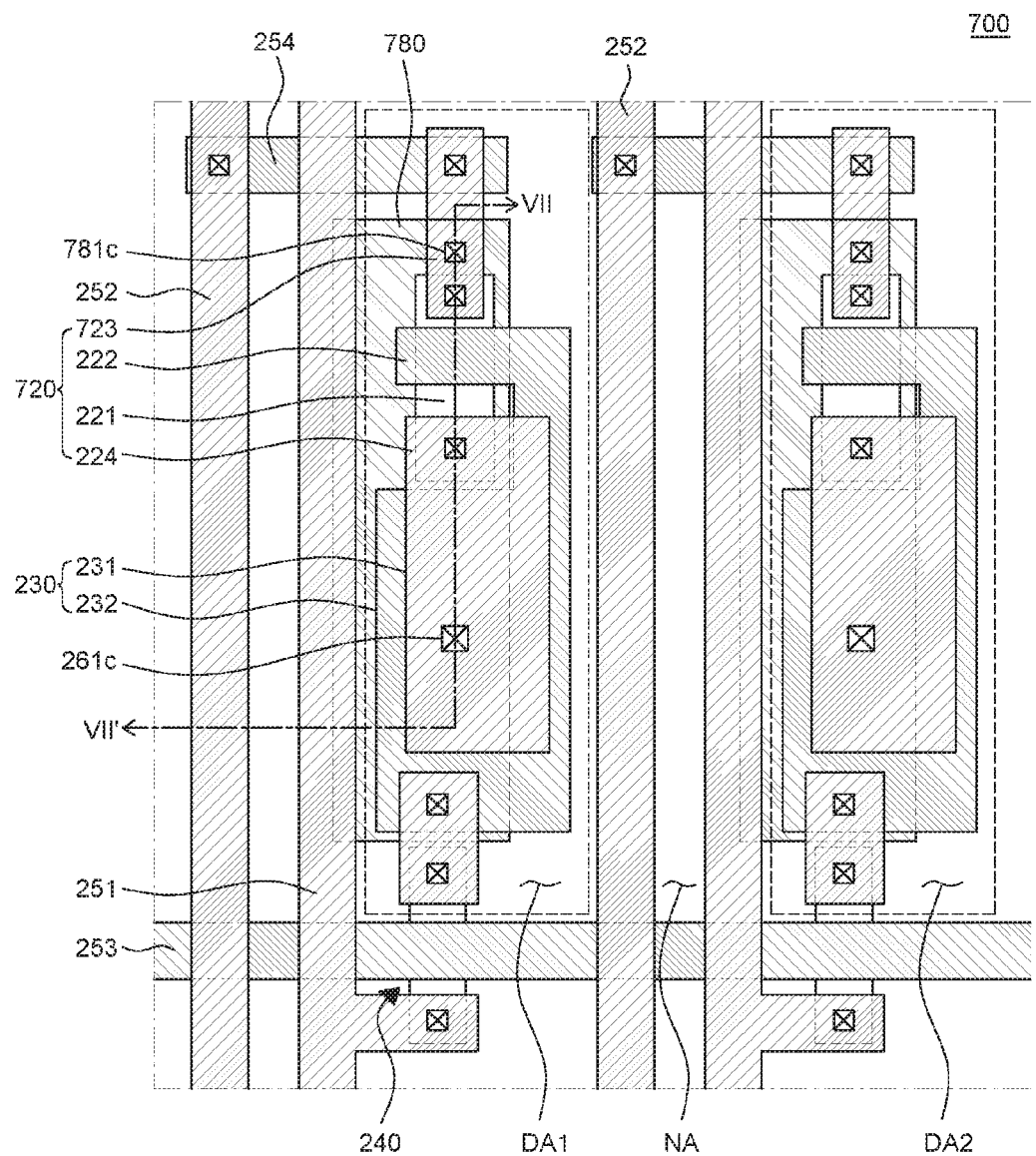
FIG. 7A is a schematic plane view illustrating an organic light emitting display device according to still another exemplary embodiment of the present disclosure.
Figure 7B:
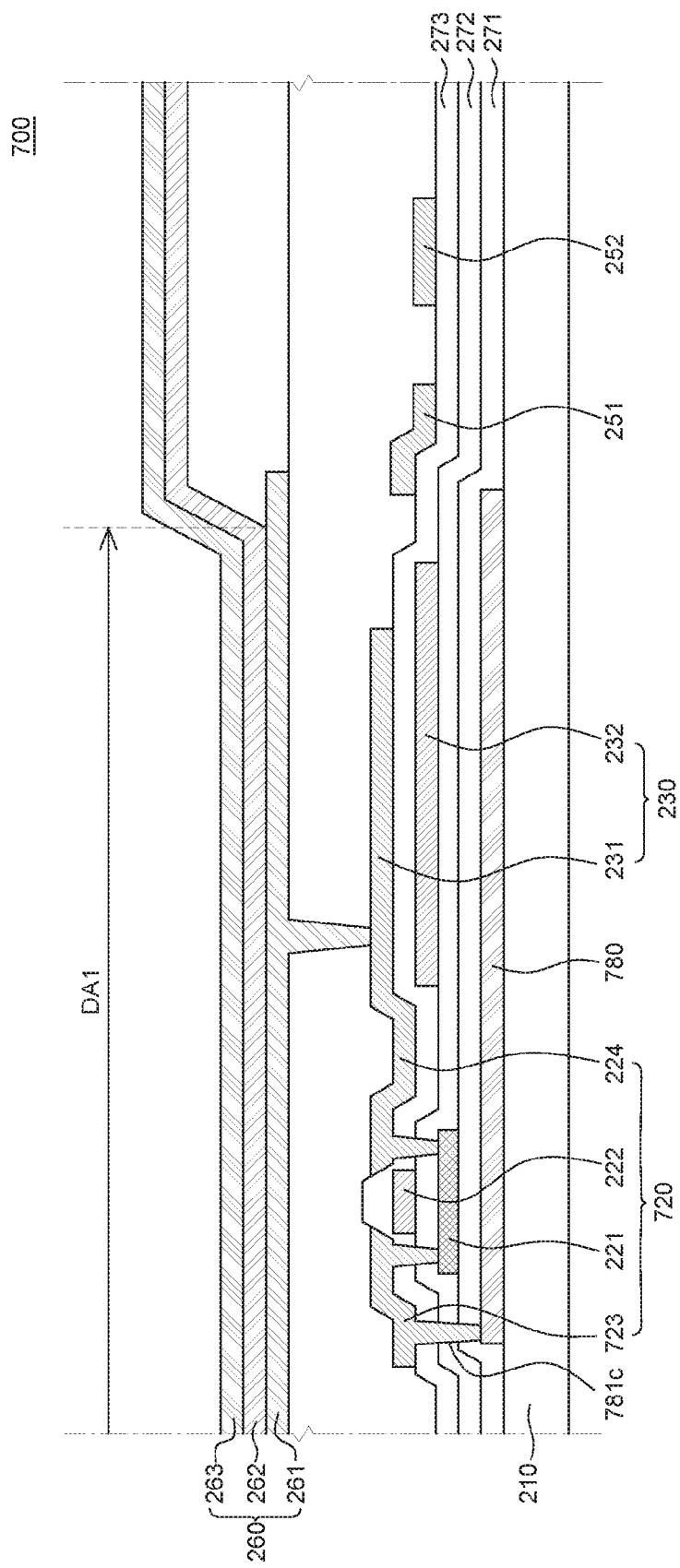
FIG. 7B is a schematic cross-sectional view taken along a line VII-VII' of FIG. 7A.

FIG. 7A and FIG. 7B are a schematic plane view and cross-sectional view, respectively, provided to describe an organic light emitting display device 700 according to still another exemplary embodiment of the present disclosure. The organic light emitting display device 700 is characterized in that a separate shield unit 780 is disposed under the active layer 221 of the driving thin film transistor 220, as compared with the organic light emitting display devices according to the exemplary embodiments of the present disclosure. Further, structural features of the organic light emitting display device 700 can be combined with the features of the organic light emitting display devices according to the exemplary embodiments of the present disclosure. Hereinafter, for convenience in explanation, redundant descriptions about the organic light emitting display devices 200, 300, 400, 500, and 600 will be omitted.

The shield unit 780 is not extended from an active layer of a driving thin film transistor and can be separated from the active layer of the driving thin film transistor. For example, the shield unit 780 is disposed under the buffer layer 271. The shield unit 780 overlaps the first electrode 232 of the storage capacitor 230.

The shield unit 780 may be formed of a metal. For example, the shield unit 780 may be formed of silver (Ag), nickel (Ni), gold (Au), platinum (Pt), aluminum (Al), copper (Cu), or molybdenum/aluminum neodymium (Mo/AlNd).

The shield unit 780 is electrically connected with an input electrode 723 of a driving thin film transistor 720. For example, a shield unit contact hole 781c is formed in the interlayer insulation layer 273, the gate insulation layer 272, and the buffer layer 271. The input electrode 723 of the driving thin film transistor 720 is connected with the shield unit 780 through the shield unit contact hole 781c, but is not limited thereto. The shield unit 780 may be connected with the output electrode 224 of the driving thin film transistor 720. Therefore, the shield unit 780 is not electrically floated, and reduces a parasitic capacitance formed between the data line 251 and the first electrode 232. Further, the shield unit 780 uniformly maintains a potential difference between the gate electrode 221 and the output electrode 224, i.e., the stored image signal.

Particularly, the shield unit 780 can cover the entire area of the gate electrode 222 adjacent to the data line 251, as compared with the organic light emitting display devices 200, 300, 400, 500, and 600 according to the other exemplary embodiments. Thus, the shield unit 780 may further reduce a parasitic capacitance. Also, the shield unit 780 may solve the problem that the input electrode can be electrically connected with the output electrode. That is, if the shield units of the other exemplary embodiments are implemented in the form of the shield unit 780, the input electrode and the output electrode are directly connected with each other by the semiconductor layer having conductive characteristic through the outside of the gate electrode without passing through the gate electrode. Therefore, the driving thin film transistor may not operate. However, the shield unit 780 may solve the problem that the driving thin film transistor cannot operate.

Because the organic light emitting display device 700 includes the shield unit 780 overlapping the first electrode 232, the parasitic capacitance formed between the first electrode 232 and the data line 251 can be reduced. Further, because the shield unit 780 is not electrically floated, it is possible to reduce a coupling effect between the data line 251 and the gate electrode 222 and also possible to improve a current holding ratio of the driving thin film transistor 720. Thus, an amount of a driving current flowing in the organic light emitting element 260 can be uniformly maintained and an image quality of the organic light emitting display device can be improved.

The exemplary embodiments of the present disclosure can be summarized again as including, for example, an organic light emitting display device configured to include a driving thin film transistor, a storage capacitor, a first pattern electrode, an anode, a patterned semiconductor layer, and a shield unit. The driving thin film transistor includes an active layer and a gate electrode; the storage capacitor includes a first electrode and a second electrode; the first pattern electrode includes a gate electrode and the first electrode; the anode is disposed on the driving thin film transistor and the storage capacitor; and the patterned semiconductor layer includes a second pattern electrode connected with an anode contact part which connects an output electrode connected with an active layer and the anode, the active layer having a semiconductive characteristic; and the shield unit has a conductive characteristic, so that it is possible to reduce a coupling effect and a parasitic capacitance and thus possible to improve crosstalk and deterioration in luminance.

A data line configured to overlap the shield unit as a portion of the patterned semiconductor layer is disposed in the organic light emitting display device. A distance between an edge of the first electrode and an edge of the adjacent shield unit may be set to be greater than a distance between the edge of the first electrode and an edge of the adjacent data line. A portion of the shield unit is configured to have a semiconductive characteristic. The active layer overlapping the first pattern electrode is configured to have a semiconductive characteristic. A portion of the shield unit which is extended further than the first pattern electrode and exposed is configured to have a conductive characteristic. The anode contact part of the second pattern electrode is configured to be connected with the shield unit and the output electrode. A first shield capacitance which varies on the basis of a data voltage (image signal) is generated between the patterned semiconductor layer and the first pattern electrode. An edge of the second pattern electrode is configured to be further extended toward the data line than the first pattern electrode. An edge of the patterned semiconductor layer is configured to be further extended toward the data line than the second pattern electrode. The edge of the second pattern electrode is configured to be further extended toward the data line than the first electrode but less extended than the edge of the patterned semiconductor layer.

In addition, the exemplary embodiments of the present disclosure include, for example, an organic light emitting display device including a shield unit, a data line, a driving thin film transistor, a storage capacitor, and an anode. The shield unit is connected with a VDD line, the data line is disposed to be adjacent to the shield unit, the driving thin film transistor is disposed on the shield unit, and includes an input electrode, a gate electrode, and an output electrode, and is connected with the VDD line, the storage capacitor is disposed on the shield unit and includes a first electrode connected with the gate electrode and a second electrode connected with the output electrode, and the anode is disposed on the driving thin film transistor and the storage capacitor and connected with the second electrode. Further, at least a portion of the shield unit disposed to be adjacent to the data line is a conductor.

A portion of the shield unit overlapping the data line is a conductor. The shield unit is connected with the input electrode of the thin film transistor and thus electrically connected with the VDD line. The shield unit is connected with the output electrode of the driving thin film transistor and thus electrically connected with the VDD line through an active layer. A predetermined area of the shield unit is a patterned semiconductor layer overlapping the first electrode, and configured to generate a capacitance which varies on the basis of a value of an image signal stored in the first electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
   a driving thin film transistor including an active layer and a gate electrode;
   a storage capacitor including a first electrode and a second electrode;
   a first pattern electrode including the gate electrode and the first electrode;
   an anode disposed on the driving thin film transistor and the storage capacitor;
   a second pattern electrode connected with an anode contact part which connects an output electrode connected with the active layer and the anode; and
   a patterned semiconductor layer including the active layer having a semiconductive characteristic and a shield unit having a conductive characteristic,
   wherein a first shield capacitance is formed between the patterned semiconductor layer and the first pattern electrode, and
   wherein the first shield capacitance varies on the basis of an image signal.

2. The organic light emitting display device according to claim 1, further comprising:
   a VDD line,
   wherein the shield unit is electrically connected with the VDD line.

3. The organic light emitting display device according to claim 2,
   wherein the shield unit is extended so as to overlap the VDD line.

4. The organic light emitting display device according to claim 1, further comprising:
   a data line configured to overlap the shield unit which is a portion of the patterned semiconductor layer.

5. The organic light emitting display device according to claim 1, further comprising:
   a data line,
   wherein a distance between an edge of the first electrode and an edge of the adjacent shield unit is greater than a distance between the edge of the first electrode and an edge of the adjacent data line.

6. The organic light emitting display device according to claim 1, wherein a portion of the shield unit overlapping the first pattern electrode is configured to have a semiconductive characteristic.

7. The organic light emitting display device according to claim 1, wherein the active layer overlapping the first pattern electrode is configured to have a semiconductive characteristic, and
   a portion of the shield unit which is extended further than the first pattern electrode and exposed is configured to have a conductive characteristic.

8. The organic light emitting display device according to claim 1, wherein the anode contact part of the second pattern electrode is connected with the shield unit and the output electrode.

9. The organic light emitting display device according to claim 1, further comprising:
   a data line,
   wherein an edge of the patterned semiconductor layer is extended further toward the data line than the second pattern electrode.

10. The organic light emitting display device according to claim 1, further comprising:
a data line; and
an input electrode connected with the active layer,
wherein a portion of the patterned semiconductor layer is extended toward the data line from the input electrode.

11. An organic light emitting display device comprising:
a shield unit electrically connected with a VDD line;
a driving thin film transistor disposed on the shield unit, the driving thin film transistor including an input electrode, a gate electrode, and an output electrode, the driving thin film transistor connected with the VDD line;
a storage capacitor disposed on the shield unit and including a first electrode connected with the gate electrode and a second electrode connected with the output electrode;
an anode disposed on the driving thin film transistor and the storage capacitor and connected with the second electrode; and
a data line disposed to be adjacent to the shield unit as compared with the first electrode,
wherein at least a portion of the shield unit disposed to be adjacent to the data line is a conductor.

12. The organic light emitting display device according to claim 11, wherein a portion of the shield unit overlaps the data line, and
the portion of the shield unit that overlaps the data line is a conductor.

13. The organic light emitting display device according to claim 11, wherein the shield unit is connected with the output electrode of the driving thin film transistor and thus electrically connected with the VDD line through an active layer.

14. The organic light emitting display device according to claim 11, wherein a predetermined area of the shield unit is a patterned semiconductor layer overlapping the first electrode, and
the predetermined area of the shield unit that is the patterned semiconductor layer is configured to generate a capacitance which varies on the basis of a value of an image signal stored in the first electrode.

15. An organic light emitting display device comprising:
a data line;
a driving thin film transistor including a gate electrode, an output electrode, an input electrode and an active layer;
a storage capacitor including a first electrode electrically connected to the gate electrode and a second electrode electrically connected to the output electrode;
an organic light emitting element including an anode electrically connected to the output electrode of the driving thin film transistor;
a shield unit including a conductive portion; and
a VDD line, wherein a portion of the semiconductor layer is extended from the input electrode toward the VDD line,
wherein the active layer and the shield unit are formed as a semiconductor layer having a specific shape, and
wherein a distance between the data line and the first electrode of the storage capacitor is larger than a distance between the data line and the conductive portion of the shield unit.

16. The organic light emitting display device of claim 15, wherein the conductive portion of the shield unit is formed of doped semiconductor material.

17. The organic light emitting display device of claim 15, wherein a portion of the semiconductor layer is extended from the input electrode toward the data line.

* * * * *